United States Patent [19]
Nagai

[11] Patent Number: 5,556,804
[45] Date of Patent: Sep. 17, 1996

[54] METHOD OF MANUFACTURING SEMICONDUCTOR LASER

[75] Inventor: Yutaka Nagai, Itami, Japan

[73] Assignee: Mitsubishi Denki Kabushiki Kaisha, Tokyo, Japan

[21] Appl. No.: 352,496

[22] Filed: Dec. 9, 1994

[30] Foreign Application Priority Data

Dec. 10, 1993 [JP] Japan ................................. 5-309600

[51] Int. Cl.$^6$ ..................................... H01L 21/20
[52] U.S. Cl. ................... 437/129; 437/133; 437/166; 437/173; 437/174
[58] Field of Search ........................ 437/129, 161, 437/173, 174, 133

[56] References Cited

U.S. PATENT DOCUMENTS

| | | | |
|---|---|---|---|
| 4,771,010 | 9/1988 | Epler et al. | 437/129 |
| 5,023,199 | 6/1991 | Murakami et al. | 437/161 |
| 5,352,628 | 10/1994 | Fumaba | 437/161 |

OTHER PUBLICATIONS

Ueno et al. in "Electronics Letters X vol. 26(20), Sep. 1990, pp. 1726–1728" in CW high power—AlGaInP visible 1 ser diode.

Fukuzawa et al. in "Appl.Phys.Letters vol. 45(1), Jul 1984, pp. 1–3" in GaAlAs buried multiqant m well lasers fabricated by diffusion-induced disordering.

Epler et al. in "Laser induced disordering of GaAs–AlGaAs superlattice—".

*Primary Examiner*—R. Bruce Breneman
*Assistant Examiner*—Ramamohan Rao Paladugu
*Attorney, Agent, or Firm*—Leydig, Voit & Mayer

[57] ABSTRACT

A method of manufacturing a ridge-buried semiconductor laser includes growing semiconductor layers including at least a first conductivity type lower cladding layer, an active layer, and a second conductivity type upper cladding layer on a semiconductor substrate; forming a striped-shaped impurity diffusion source film including atoms producing the second conductivity type when diffused into the upper cladding layer at a stripe-shaped region which becomes a top of a ridge; ridge-etching the semiconductor crystal layers using a ridge-etching mask including the impurity diffusion source film so that the second conductivity type upper cladding layer has a ridge shape; growing a first conductivity type current blocking layer to bury the ridge; and forming a high dopant impurity concentration region including a dopant impurity producing the second conductivity type impurity in the second conductivity type upper cladding layer of the ridge region by diffusing atoms from the stripe-shaped impurity diffusion source film by heat treatment. This method provides a semiconductor laser in which the element resistance is reduced, high-frequency superposition is possible at a practical level, and characteristics at the time of the high-frequency superposition are improved.

57 Claims, 23 Drawing Sheets

Active-layer thickness  d ($\mu$m)

Fig.26

MATERIAL PARAMETERS FOR $In_{0.5}(Ga_{1-x}Al_x)_{0.5}P$ USED IN THE CALCULATION

| Parameter | Value |
| --- | --- |
| Refractive index | $n_r = 3.65-0.37x$ |
| Dielectric constant | $\varepsilon = (12.0-2.0x)\varepsilon_0$ |
| Bandgap | $E_{g\Gamma} = 1.90+0.6x(eV)$<br>$E_{gX} = 2.25+0.1x(eV)$ |
| Band offset (relative to GaAs) | $\Delta E_{c\Gamma} = 0.19+0.27x(eV)$<br>$\Delta E_v = 0.30+0.32x(eV)$ |
| Effective mass | $m_{e\Gamma} = 0.099m_0$<br>$m_{eX} = 0.35m_0$<br>$m_h = (0.62+0.05x)m_0$ |
| Nonradiative recombination lifetime | $\tau_n, \tau_p = 9(ns)$(active layer)<br>$\tau_n, \tau_p = 1(ns)$(cladding layer) |
| Gain coefficient<br>$(g = g_0+g_{np}np)$ | $g_0 = -100(cm^{-1})$<br>$g_{np} = 1.4\times10^{-35}(cm^5)$ |

METHOD OF MANUFACTURING SEMICONDUCTOR LASER

BACKGROUND OF THE INVENTION

1. Field of the Invention

The present invention relates to a method of manufacturing a semiconductor laser and, more particularly, to a method of manufacturing a semiconductor laser for a light source of an optical disc, having a preferable characteristic at the time of high-frequency superposition. In addition, the present invention relates to a structure and a method of manufacturing a semiconductor laser having a window structure at its facet and capable of high-output operation.

2. Description of the Prior Art

A prior art short-wavelength InGaAlP visible light laser diode is reported in, "Short-Wavelength InGaAsP visible Light Laser Diode" IEEE JOURNAL OF QUANTUM ELECTRONICS. VOL. 27, NO.6, JUNE 1991, Gen-ichi Takahashi et.al. pages 1476–1482.

The contents of this publication will be quoted in order to describe the prior art short-wavelength InGaAlP visible light laser diode.

Considerable progress has been made in the development of short-wavelength InGaAlP visible-light laser diodes. This paper describes the recent results achieved on the operation of these InGaAlP lasers. It is found that there is a strong correlation between operation temperature and oscillation wavelength. The deterioration of favorable temperature characteristics in the short-wavelength region is attributed to an increase in the leakage current, which originates in a small conduction-band discontinuity inherent in the InGaAlP material system. The introduction of a highly doped p-cladding layer has a remarkable effect on the improvement of these temperature characteristics. Short-wavelength oscillation at 630 nm band wavelength was achieved for transverse-mode stabilized InGaAlP lasers.

I. INTRODUCTION

InGaAlP visible-light laser diodes oscillating in the 0.6 µm wavelength range have attracted much interest as light sources for optical information processing systems, such as high-density optical disk systems and high-speed laser printers. Room-temperature continuous-wave (CW) operation of InGaAlP lasers was first achieved in 1985 for InGaP ternary active layers at a wavelength of 670–690 nm. Since then, much effort has been expended on the improvement of laser performance, such as transverse-mode stabilization, threshold-current reduction, high-temperature operation, and high reliability.

Among these laser diode characteristics, high-power and short-wavelength operation are important subjects for the practical use of InGaAlP lasers. High-power operation is required especially for optical disk applications. Fundamental methods, previously used to obtain high-power operation for conventional GaAlAs lasers, are applicable to the InGaAlP systems. High-power CW operation, as high as 50 mW, has been achieved for a transverse-mode stabilized InGaAlP laser by using a thin active-layer structure and antireflection and high-reflection coatings on the laser facets. A high-power broad stripe laser, with 320 mW output power, was also reported. There has also been a remarkable improvement in the reliability of high-power InGaAlP lasers. Transverse-mode stabilized InGaAlP lasers with 20 mW output power are now commercially available. The topical achievement in 1990 for high-power InGaAlP lasers was the realization of a window-structure laser. By using window structures, output powers were increased to 80 and 75 mW for the InGaAlP lasers with gain-guided and transverse-mode stabilized structures, respectively.

The development of shorter-wavelength InGaAlP laser diodes, oscillating below 670 nm, has been continued for use in high-density optical disk applications and the realization of a small-size light source of relevant emission wavelength for the substitution of conventional HeNe gas lasers ($\lambda$=633 nm). Three methods were investigated for obtaining short-wavelength InGaAlP laser diodes: 1) employment of InGaAlP quaternary active layer, 2) quantum-well structure, and 3) utilization of the bandgap energy dependence on the substrate orientation. The first method is a relatively simple, but fundamental, approach for shortening the oscillation wavelength.

The problem in realizing a short-wavelength InGaAlP laser diode is that it is difficult to obtain high-temperature operation. The maximum operation temperature decreases with decreasing wavelength. For practical use of short-wavelength InGaAlP lasers, improvement of the temperature characteristics is indispensable. The deterioration of the temperature characteristics in the short-wavelength region is thought to originate from an increase in a leakage current caused by a small bandgap energy difference between the active and the p-type cladding layers. The leakage current is reduced by using a large bandgap cladding layer or by using a highly doped p-type cladding layer. The bandgap energy of the cladding layer has a limit determined by an InGaAlP material system which is lattice matched to the GaAs substrate. Therefore, it was found necessary to employ a highly doped cladding layer for realizing short-wavelength InGaAlP laser diodes. Recently, a crystal growth technique, which yields a highly doped p-type cladding layer, has been developed. This effectively improved the temperature characteristics of InGaAlP laser diodes. Due to this improvement, 630 nm band CW operation at room temperature has been realized.

This paper reviews our recent results on the short-wavelength operation of InGaAlP visible-light laser diodes. The transverse-mode stabilized structures used for the short-wavelength InGaAlP lasers are briefly shown. Theoretical background for the reduction of the leakage current and experimental results of short-wavelength InGaAlP laser diodes will be described.

II. DEVICE STRUCTURE FOR TRANSVERSE-MODE STABILIZED InGaAlP LASER DIODES

For the realization of short-wavelength InGaAlP laser diodes, employment of a transverse-mode stabilized structure is necessary for operation-current reduction, as well as for the practical application of the device. FIG. 14 shows a typical configuration for the transverse-mode stabilized InGaAlP laser. This structure was fabricated by a three-step metalorganic chemical vapor deposition (MOCVD) method, including the n-GaAs layer growth, utilizing a selective growth on the ridge-shaped double-heterostructure. So the structure was called a selectively buried ridge waveguide (SBR) laser.

The optical-mode confinement in the SBR laser is obtained by using a loss-guide effect, which is produced by a complex refractive-index distribution along the junction plane. In such a ridge-stripe structure, the effective refractive-index difference $\Delta N_{eff}$ between the stripe and outside region is an improvement factor for the optical characteristics of the output beam. $\Delta N_{eff}$ is determined by the refractive indexes of each layer, active-layer thickness d, and distance h between the active layer and the n-GaAs absorbing layer in the region outside the stripe. FIG. 15 shows a calculated example of $\Delta N_{eff}$ as a function of d and h for the case of InGaP active layer and $In_{0.5}(Ga_{0.3}Al_{0.7})_{0.5}P$ cladding layers. The preferable value of $\Delta N_{eff}$, for realizing stable fundamental-mode oscillation and low-astigmatism characteristic, is about $10^{-2}$. The parameters d and h should be optimized to satisfy this requirement.

FIG. 16 shows another structure for a transverse-mode stabilized InGaAlP laser. In this laser, current confinement is realized by utilizing a heterobarrier caused by a large band discontinuity between the p-InGaAlP cladding layer and p-GaAs contact layer. The laser is called a heterobarrier-blocking (HBB) laser. The principle of the current confining mechanism for the HBB laser is shown in FIG. 17. Material parameters, used in the calculation for FIG. 17 and other figures shown later, are listed in FIG. 26. A characteristic feature of the InGaAlP material is that the valence band discontinuity $\Delta E_v$ between InGaAlP and GaAs is very large. This band discontinuity causes a large spike in the valence-band profile at the interface of p-InGaAlP and GaAs, which acts as a barrier for the holes. When the Al composition ratio, of the p-InGaAlP, is relatively large, current does not flow through the p-InGaAlP-p-GaAs interface, as shown in FIG. 17(a). Conversely, the valence-band spike is reduced by introducing a p-InGaP layer which has an intermediate bandgap energy between InGaAlP and GaAs. Therefore, current easily flows in the structure shown in FIG. 17(b), which corresponds to the configuration of the stripe region of the HBB laser.

The optical characteristics of the SBR and the HBB lasers are almost identical, because the optical confinement mechanism is essentially the same. In regard to the fabrication process, the HBB laser is simpler to grow than the SBR laser because the HBB structure requires only a two-step MOCVD growth process.

These transverse-mode stabilized structures, shown in FIGS. 14 and 16, were used for the production of short-wavelength InGaAlP lasers. The characteristics of these lasers will be shown later.

III. THEORETICAL BACKGROUND FOR SHORT-WAVELENGTH OPERATION

Difficulties in shortening the lasing wavelength of the InGaAlP laser diode arise from electron leakage from the active layer to the p-type cladding layer. FIG. 18 shows a schematic band diagram for the InGaAlP double-heterostructure laser at an oscillation threshold. In the InGaAlP double-heterostructure, the conduction-band discontinuity and the bandgap difference between the active and the cladding layers, are not so large. For example the conduction-band discontinuity value for the InGaP-$In_{0.5}(Ga_{0.3}Al_{0.7})_{0.5}P$ double-heterostructure, which has the largest bandgap difference within the extent of direct-transition region, is 0.19 eV. Due to this small value for the conduction-band heterobarrier, a part of the injected current overflows from the active layer to the p-type cladding layer, as shown in FIG. 18.

The effect of the electron overflow is seen to a much greater extent during high-temperature operation, because the barrier height $\delta_p$ (see FIG. 18) decreases due to the increase in the quasi-Fermi level $\phi_n$ in the active layer caused by a high-injection current at the higher temperature. FIG. 19 shows a calculated example of the temperature dependence of threshold-current density for the InGaP-$In_{0.5}(Ga_{0.3}Al_{0.7})_{0.5}P$ double-heterostructure. The total threshold current is represented as a summation of net injection current into the active layer and the leakage current $J_L$. The net injection current density shows a temperature dependence with a characteristic temperature of 200 K. The apparent characteristic temperature at room temperature is lower than this value due to the existence of the leakage current. Most of this leakage current is attributed to the electron overflow current, which flows over the heterobarrier at the conduction band between the active and the p-type cladding layers.

The electron overflow becomes more and more conspicuous for shorter-wavelength laser diodes. This is attributed to the decrease in the heterobarrier height caused by the reduction in bandgap energy difference between the active and the cladding layers. Therefore, it is difficult to realize high-temperature operation in the short-wavelength region.

The electron overflow is reduced by increasing the barrier height between the quasi-Fermi level in the conduction band of the active layer and the bottom of the conduction band of the p-type cladding layer. As shown in FIG. 18, the barrier height $\delta_p$ is determined by the bandgap energy difference between the active and the p-type cladding layers, and the Fermi level, $E_{fp}$, of the p-type cladding layer. The Fermi level $E_{fp}$ is determined by the hole concentration in the cladding layer. Therefore, $\delta_p$ is increased by using either a large bandgap or a highly doped cladding layer.

FIG. 20 shows numerical simulation results for the threshold-current density as a function of active-layer bandgap. The drastic increase in the threshold current in the shorter-wavelength region is attributed to electron overflow. Experimental data for the laser diodes, having an $In_{0.5}(Ga_{0.3}Al_{0.7})_{0.5}P$ cladding layer with a hole concentration of $4\times10^{17}$ $cm^{-3}$ showed a similar tendency as the corresponding curve in FIG. 20. However, the increase in the threshold current occurred over a longer wavelength region than that shown by the calculated results. This difference is considered to originate from an assumption in the calculation, whereby the nonradiative recombination lifetime, for the active layer, was assumed to be equal to that for InGaP and independent of the Al composition.

As shown in FIG. 20, the threshold current, in shorter-wavelength region devices, is reduced by using a p-type cladding layer with a high Al composition ratio, which has a large bandgap energy, and a high hole concentration. Although the bandgap of InAlP (x=1) is indirect and the conduction band offset is smaller than that for $In_{0.5}(Ga_{0.3}Al_{0.7})_{0.5}P$, it still has the effect of reducing the electron overflow. This is because the barrier height $\delta_p$, in FIG. 18, is determined mainly by $E^{clad}$ and $E_{fp}$.

IV. EXPERIMENTAL RESULTS

As indicated above, a higher Al composition ratio, and a higher hole concentration for p-type cladding layer, is preferable for the development of short-wavelength InGaAlP laser diodes. However, it is difficult to obtain a highly doped p-type cladding layer, especially for high-Al-composition InGaAlP. Therefore, it is necessary to choose an optimum Al composition ratio for the cladding layer. In the experiment, an Al composition ratio of 0.7, a point at which the InGaAlP has its largest direct bandgap, was selected. For the case of Zn p-type doping, a limiting factor exists; that is, at high concentrations doping causes Zn diffusion into the active layer, which results in a degradation of device characteristics. The maximum doping level, without Zn diffusion into the active layer, depends on the growth conditions, for example, growth temperature. Zn doping characteristics were investigated in detail for InGaAlP double-heterostructures. It was found that this diffusion into the active layer does not occur for acceptor concentration levels below $6\times10^{17}$ $cm^{-3}$, under optimized growth conditions. The use of such a highly doped p-type cladding layer effectively improved the temperature characteristics of the short-wavelength InGaAlP laser diodes. Due to this improvement, a high-temperature short-wavelength oscillation device was obtained for a laser employing an InGaAlP quaternary active layer.

FIG. 21 shows the experimental results representing the relationship between the oscillation wavelength and the maximum temperature for continuous-wave operation of InGaAlP lasers. As shown in the figure, there is a strong correlation between maximum operation temperature $T_{max}$ and the wavelength $\lambda$. The shorter the wavelength is, the lower the possible operation temperature becomes. This is considered to originate in the electron overflow as described above. The effect of the highly doped p-type cladding layer, predicted in FIG. 20, was also confirmed by experiment. As shown in FIG. 21, there was a remarkable improvement for $T_{max}$ when the acceptor concentration was $5 \times 10^{17}$ cm$^{-3}$.

By using the highly doped p-type cladding layer (p=$5 \times 10^{17}$ cm$^{-3}$), the maximum CW temperature is increased to 70° C. for a laser with an oscillation wavelength of 650 nm, as shown in FIG. 21. FIG. 22 shows the characteristic temperature of the 650 nm wavelength SBR lasers plotted against acceptor concentration. A higher characteristic temperature was obtained by employing a higher acceptor concentration. FIG. 23 shows an example of the aging test results for uncoated 650 nm lasers at a heat-sink temperature of 50° C. The lasers operated for more than 1000 h.

For realizing a 630 nm band InGaAlP laser, the Al composition ratio for the active layer was set as 0.15. The SBR structure with this quaternary active layer, and $In_{0.5}(Ga_{0.3}Al_{0.7})_{0.5}P$ cladding layers, was fabricated. FIG. 24 shows light output versus current characteristics for this 630-nm-band SBR laser. Room-temperature CW operation at a wavelength of 638 nm was achieved. The threshold current at 25° C. was 100 mA and slope efficiency was 0.35 W/A/facet. Continuous-wave operation was maintained, even at 50° C. This improvement in the operation temperature is considered to be the effect of the leakage-current reduction brought about by the high doping technique for the p-cladding layer.

Short-wavelength operation was also achieved by using the HBB structure. FIG. 25 shows light output versus current characteristics for the 630 nm band HBB laser. A single longitudinal mode oscillation at a wavelength of 636.1 nm was obtained. The beam divergence angles in the direction parallel and perpendicular to the junction plane were 8.5° and 39°, respectively.

Hereinafter, a specific structure, a function, and an operation of a conventional 0.67 µm band InGaP/InAlGaP semiconductor laser will be described.

FIG. 11 is a schematic view of a conventional 0.67 µm band InGaP/InAlGaP semiconductor laser which is the same as the laser described alone, and FIGS. 12(a)–12(h) are sectional views showing manufacturing steps of the semiconductor laser. In FIG. 11, an n-$(Al_{0.7}Ga_{0.3})_{0.5}In_{0.5}P$ cladding layer 2 having an impurity concentration of $1 \times 10^{17}$ cm$^{-3}$ and a thickness of 1.5 µm is disposed on an n-GaAs semiconductor substrate 1 having an impurity concentration of 1 to $3 \times 10^{18}$ cm$^{-3}$ and a thickness of 95 µm. An undoped $In_{0.5}Ga_{0.5}P$ active layer 3 having a thickness of 0.07 µm is disposed on the n-$(Al_{0.7}Ga_{0.3})_{0.5}In_{0.5}P$ cladding layer 2. A p-$(Al_{0.7}Ga_{0.3})_{0.5}In_{0.5}P$ upper cladding layer 4 having an impurity concentration of $5 \times 10^{17}$ (the impurity is Zn or Si) and a thickness of 0.25 µm is disposed on the $In_{0.5}Ga_{0.5}P$ active layer 3. A p-GaAs first contact layer 5 having an impurity concentration of $2 \times 10^{19}$ cm$^{-3}$ and a thickness of 0.4 µm is disposed on a ridge 4a of the p-$(Al_{0.7}Ga_{0.3})_{0.5}In_{0.5}P$ upper cladding layer 4. The width of the ridge is 5.5 µm at the bottom and 3.0 µm at the top surface. An n-GaAs current blocking layer 9 having an impurity concentration of $6 \times 10^{18}$ cm$^{-3}$ and a thickness of 1 µm is disposed on a thin portion 4b of the p-$(Al_{0.7}Ga_{0.3})_{0.5}In_{0.5}P$ upper cladding layer 4. A p-GaAs second contact layer 11 having an impurity concentration of $2 \times 10^{19}$ cm$^{-3}$ and a thickness of 2.5 µm is disposed on the p-GaAs first contact layer 5 and on the n-GaAs current blocking layer 9. In addition, a p-side electrode 12 comprising Ti/Pt/Au is disposed on the p-GaAs second contact layer 11, and an n-side electrode 13 comprising AuGe/Ni/Ti/Au is disposed on the p-GaAs semiconductor substrate 1. The height of the laser except the electrodes is 100 µm.

In FIGS. 12(a)–12(h), a selective growth mask 16 comprising $SiO_2$ or $Si_3N_4$ is formed on the p-GaAs first contact layer 5, and a stripe-shaped selective growth mask 16a is formed by patterning the selective growth mask 16. A ridge region 8 comprising the p-$(Al_{0.7}Ga_{0.3})_{0.5}In_{0.5}P$ cladding layer 4 and the p-GaAs first contact layer 5 is formed by etching, using the patterned stripe-shaped selective growth mask 16a.

Next, a manufacturing method of the conventional semiconductor laser will be described referring to FIGS. 12(a)–12(h).

First, the n-$(Al_{0.7}Ga_{0.3})_{0.5}In_{0.5}P$ cladding layer 2, the $In_{0.5}Ga_{0.5}P$ active layer 3, the p-$(Al_{0.7}Ga_{0.3})_{0.5}In_{0.5}P$ cladding layer 4, and the p-GaAs first contact layer 5 are epitaxially grown on the n-GaAs semiconductor substrate 1 by an MOCVD (Metal Organic Chemical Vapor Deposition) method at 750° C. FIG. 12(a) shows a sectional view of a grown wafer.

Then, the selective growth mask 16 comprising $SiO_2$ or $Si_3N_4$ is patterned so as to form the stripe-shaped film 16a as shown in FIG. 12(c). The width of the stripe is appropriately 5 to 15 µm.

The selective growth mask 16a serves as a mask for ridge etching. More specifically, as shown in FIG. 12(d), etching is performed so as to produce the ridge 8 using the selective growth mask 16a. The etching is performed into the p-GaAs first contact layer 5 and into the middle of the p-$(Al_{0.7}Ga_{0.3})_{0.5}In_{0.5}P$ cladding layer 4 (leaving a thickness of 0.3 µm) to form the ridge 8. FIG. 12(d) shows a sectional view after the etching.

Then, as shown in FIG. 12(e), crystal growth is performed again and the part other than the ridge 8 is buried with the n-GaAs current blocking layer 9 having an impurity concentration of $6 \times 10^{18}$ cm$^{-3}$ and a thickness of 1 µm. At this time, since the selective growth mask 16a exists at the ridge 8, there is no crystal growth thereon. During the crystal growth, the wafer is heated at 500° C. or more (for example, 550° C.) for approximately 30 minutes.

Then, as shown in FIG. 12(f), the selective growth mask 16a is etched away by wet or dry etching and then, the p-GaAs second contact layer 11 is further grown on the ridge 8 and on the n-GaAs current blocking layer 9.

Alternatively, in some cases, after the state shown in FIG. 12(e), the ridge etching mask 16a is removed to form the state shown in FIG. 12(g) and, in this state, the impurity diffusion source film 7 comprising ZnO or the like is formed on the ridge 8 again. Then, p type impurities in the impurity diffusion source film 7 are diffused into the first contact layer 5 and the p type upper cladding layer 4 by heat treatment to form the p type diffused region 10. Then, the impurity diffusion source film 7 is removed and the second contact layer 11 is grown on the whole surface of the wafer.

Then, the n-side electrode 13 comprising AuGe/Ni/Ti/Au is formed on the n-GaAs semiconductor substrate 1 and the p-side electrode 12 comprising Ti/Pt/Au is formed on the p-GaAs second contact layer 11 using vapor deposition by resistance heating, EB (electron beam) deposition, or sputtering. Alternatively, after the step of FIG. 12(g), the electrodes are formed as described above. Thus, the conventional semiconductor laser shown in FIG. 11 is completed.

Next, function and operation of the conventional example will be described.

First, an operation of the conventional 0.67 μm band semiconductor laser shown in FIG. 11 will be described.

When a voltage is applied so as to be positive on the p-side electrode and be negative on the n-side electrode, holes are injected into the $In_{0.5}Ga_{0.5}P$ active layer 3 through the p-GaAs second contact layer 11, the p-GaAs first contact layer 5, and the p-$(Al_{0.7}Ga_{0.3})_{0.5}In_{0.5}P$ cladding layer 4, and electrons are injected into the $In_{0.5}Ga_{0.5}P$ active layer 3 through the n-GaAs semiconductor substrate 1 and the n-$(Al_{0.7}Ga_{0.3})_{0.5}In_{0.5}P$ cladding layer 2. Consequently, the holes are recombined with the electrons and induced emission light is generated in the active layer 3. When the carriers are injected in a sufficiently large amount and light is generated beyond its loss in the waveguide of the active layer 3, laser oscillation occurs.

Then, the structure of the ridge will be described. According to the ridge structure having the ridge region 8 comprising the p-$(Al_{0.7}Ga_{0.3})_{0.5}In_{0.5}P$ cladding layer 4 and the p-GaAs first contact layer 5, a pn junction is formed between the p-$(Al_{0.7}Ga_{0.3})_{0.5}In_{0.5}P$ cladding layer 4 and the n-GaAs current blocking layer 9 and between the p-GaAs second contact layer 11 and the n-GaAs current blocking layer 9 at a region covered with the n-GaAs current blocking layer 9 other than the stripe-shaped ridge region 8. Therefore, even if a voltage is applied so that the p-electrode 12 becomes positive, since a pnp structure is formed between the p-$(Al_{0.7}Ga_{0.3})_{0.5}In_{0.5}P$ cladding layer 4 and the p-GaAs second contact layer 11 at the region other than the ridge region 8, that is, there is a reverse bias, and a current does not flow. More specifically, since the n-GaAs current blocking layer 9 blocks the current literally, a current flows only in the ridge region 8. Therefore, the current is concentrated in the region of the active layer 3 in the vicinity of the ridge, whereby a current density sufficient for laser oscillation is attained. As a result, laser oscillation occurs.

In addition, the n-GaAs current blocking layer 9 has a property of absorbing the laser light generated in the active layer 3 because the band gap energy of GaAs is smaller than the band gap energy of $In_{0.5}Ga_{0.5}P$ constituting the active layer 3. Therefore, since the laser light is strongly absorbed on both sides of the ridge 8, the laser light is also concentrated in the region in the vicinity of the ridge 8. As a result, a horizontal transverse-mode, which is an important characteristic in the stable operation of the semiconductor laser, has a configuration of a single-ridge.

As can be seen from the contents of the above quoted publication, although the laser characteristic of the semiconductor laser comprising InGaAlP system materials is improved by increasing the impurity concentration of the p type cladding layer, when a normal doping technique is used, it is difficult to increase the p type impurity concentration of the InGaAlP cladding layer, and an effective method for improving the p type impurity concentration of the p type cladding layer is not particularly specified in the above publication.

In addition, according to an AlGaAs or InGaP/InAlGaP system semiconductor laser which emits laser light in a band of 0.8 μm or 0.67 μm, used as a light source of an optical disc device, such as a compact disc (CD), the maximum optical output is decided by an optical output at which facet destruction occurs. The facet destruction occurs when the laser beam is absorbed by a surface level in a facet region. Therefore, in order to realize a high optical output operation, it is necessary to devise something so as not to generate the facet destruction even at the time of high-optical output. In this respect, it is very effective to provide a structure that prevents the laser beam from being absorbed at the facet region, that is, a window structure which is transparent to the laser beam.

The window structure to prevent the facet destruction in the semiconductor laser will be described hereinafter.

Catastrophic optical damage (COD) generated at the time of high-output operation of the semiconductor laser is caused by the band gap of the facet portion is smaller than that of the central portion even in the active layer of the same composition because of an interface level existing in the vicinity of the facet of the laser. More specifically, a temperature is partially raised at the facet because of absorption of laser light in the vicinity of the facet at the time of the high-output operation of the laser. Since the partial excessive heat generation further reduces the band gap at that part, absorption of laser light is accelerated so that the heat generation is increased, which becomes a feedback loop. At last, the laser facet is melted and irreversible destruction occurs. The laser output when the facet destruction occurs is called COD optical output, and the COD optical output restricts the maximum optical output of the semiconductor laser comprising AlGaAs or AlGaInP system materials.

In order to prevent the above-described facet destruction, the band gap of the active layer at a region where the interface level could be produced is made larger than that of the active layer at another region. For example, in Conference on Applied Physics in 1990, spring (Proceedings 29a-SA-7), there is disclosed a AlGaInP system semiconductor laser whose COD optical output is significantly increased to be high-powered by a window structure in which a forbidden band width of the active layer in the vicinity of the laser facet is wider than that of the active layer in the center of the laser.

It is known that when GaInP or AlGaInP crystal material is grown under a predetermined growth condition, a natural superlattice in which component atoms are periodically arranged is formed as a phenomenon peculiar to that material. In addition, it is known that when an impurity such as Zn is introduced into crystals having the natural superlattice structure to disorder the superlattice structure, a forbidden band width at the disordered region is larger than that of the region which is not disordered. In the above publication, the window structure is formed in such a manner that impurities are introduced in the vicinity of the laser facet after the growth of the active layer comprising GaInP or AlGaInP under a condition in which the natural superlattice is produced.

FIG. 27 is a schematic view showing a section of the conventional AlGaInP system semiconductor laser having the window structure in the longitudinal direction of a resonator. In FIG. 27, an n type AlGaInP lower cladding layer 102 is disposed on an n type GaAs substrate 101, a GaInP quantum-well (QW) active layer 103 having a natural superlattice structure is disposed on the lower cladding layer 102, a p type AlGaInP upper cladding layer 104 is disposed on the active layer 103, and a p type GaAs contact layer 105 is disposed on the upper cladding layer 104. In addition, an n-side electrode 106 is disposed on the n type GaAs substrate and a p-side electrode 107 is disposed on the p type GaAs contact layer 105. A Zn diffused region 108 is formed in the vicinity of the laser facet and a region 109 is formed in the active layer 103 by disordering the natural superlattice through Zn diffusion. In addition, laser beam 120 is emitted.

FIGS. 29(a)–29(d) show process steps of the manufacturing method of the AlGaInP system semiconductor laser having the window structure shown in FIG. 27. In the figures, the same references designate the same or corresponding parts in FIG. 27. The manufacturing steps of the semiconductor laser shown in FIG. 27 will be described referring to FIGS. 29(a)–29(d).

First, the n type AlGaInP lower cladding layer 102, the AlGaInP quantum-well active layer 103 and the p type AlGaInP upper cladding layer 104 are sequentially grown on the n type GaAs substrate 101, preferably by MOCVD. Then, the p type GaAs contact layer 105 is grown on the upper cladding layer 104, whereby a laser laminated structure shown in FIG. 29(a) is formed. At this time, its growth condition is controlled so that the crystal structure of the active layer 103 is the natural superlattice structure.

Then, as shown in FIG. 29(b), there is formed an $SiO_2$ film pattern 110 having an opening 110a in the vicinity of a cleavage position shown by a two-dotted line in the figure. The width w of the opening 110a is approximately 20 μm with regard to precision of the cleavage.

Then, as shown in FIG. 29(c), Zn atoms are diffused in the laser laminated structure by vapor-phase diffusion or solid-phase diffusion using the $SiO_2$ film pattern 110 as a mask, to form the Zn diffused region 108. By the diffusion of Zn, the region in the vicinity of the laser facet of the active layer 103 becomes the region 109 in which the natural superlattice structure is disordered. The diffusion speed of Zn in GaAs is different from that in AlGaInP. Generally, it is higher in the AlGaInP quantum-well active layer 103 and the upper and lower AlGaInP cladding layers 104 and 102 than in the GaAs substrate 101 and the contact layer 105.

Then, the $SiO_2$ film pattern 110 is removed and as shown in FIG. 29(d), the n-side electrode 106 is formed on the rear surface of the substrate 101, the p-side electrode 107 is formed on the contact layer 105, and a resonator facet 150 is formed by isolating elements by cleaving, whereby the semiconductor laser shown in FIG. 27 is completed.

Next, an operation thereof will be described. When a forward bias to the pn junction of the laser is applied to the n-side electrode 106 and the p-side electrode 107, electrons and holes are injected into the active layer 103 and recombined in the active layer 103 to emit light. The light generated in the active layer 103 is guided between a pair of resonator facets 150 along the active layer, and reflection and amplification are repeated to produce laser oscillation. At this time, the region in the vicinity of the resonator facet of the active layer 103 is the region 109 in which the natural superlattice structure is disordered by diffusion of Zn and the forbidden band width of the region 109 is larger than that of the active layer in the center of the laser in which the natural superlattice structure is not disordered. Consequently, according to the conventional example, absorption of light is prevented at the laser facet and, therefore, high-output laser operation becomes possible.

In addition, FIG. 28 is a schematic view showing a section of a conventional AlGaInP system semiconductor laser having another window structure in the longitudinal direction of the resonator. In FIG. 28, the same references as in FIG. 27 designate the same or corresponding parts, and a Zn diffused region 118 is formed in the vicinity of the laser facet by introducing impurities from the laser facet.

FIGS. 30(a)–30(d) are sectional views illustrating process steps in a manufacturing method of the AlGaInP system semiconductor laser having the window structure shown in FIG. 28. In the figures, the same references as in FIGS. 29(a)–29(d) designate the same or corresponding parts. The manufacturing steps of the semiconductor laser shown in FIG. 28 will be described referring to FIGS. 30(a)–30(d).

First, the n type AlGaInP lower cladding layer 102, the AlGaInP quantum-well active layer 103, and the p type AlGaInP upper cladding layer 104 are sequentially grown on the n type GaAs substrate 101, preferably by MOCVD. Then, the p type GaAs contact layer 105 is grown on the upper cladding layer 104, whereby the laser laminated structure shown in FIG. 30(a) is formed. At this time, growth conditions are controlled so that the crystal structure of the active layer 103 has the natural superlattice structure.

Then, as shown in FIG. 30(b), the laser laminated structure is cleaved at a position shown by the two-dotted line in FIG. 30(a) to form the resonator facet 150.

Then, Zn atoms are diffused from the resonator facet 150 into the laser laminated structure by vapor-phase diffusion or solid-phase diffusion, whereby the Zn diffused region 108 is formed as shown in FIG. 30(c). By the diffusion of Zn, the region in the vicinity of the laser facet of the active layer 103 becomes the region 109 in which the natural superlattice structure is disordered. At this time, the depth of the impurity diffusion is set so that the length d of the disordered region 109 (length of the window region) is 4 to 5 μm.

Then, as shown in FIG. 30(d), the n-side electrode 106 is formed on the rear surface of the substrate 101 and the p-side electrode 107 is formed on the contact layer 105, whereby the semiconductor laser shown in FIG. 28 is completed.

Next, an operation thereof will be described. When a forward bias to the pn junction of the laser is applied to the n-side electrode 106 and the p-side electrode 107, electrons and holes are injected into the active layer 103 and recombined in the active layer 103 to emit light. The light generated in the active layer 103 is guided between a pair of resonator facets 150 along the active layer 103, and reflection and amplification are repeated to produce laser oscillation. The region in the vicinity of the resonator facet of the active layer 103 is the region 109 in which the natural superlattice structure is disordered by diffusion of Zn, and the forbidden band width of the region 109 is larger than that of the active layer in the center of the laser in which the natural superlattice structure is not disordered. Consequently, according to the conventional example, similar to the conventional example shown in FIG. 27, absorption of light is prevented at the laser facet and, therefore, high-output laser operation becomes possible. In addition, according to the conventional example, when the impurities are directly introduced from the resonator facet, the length of the window region in which the impurities are diffused is shorter than that in the conventional example shown in FIG. 27, whereby loss of absorption in the window region because of the impurities are reduced.

Similar to the above description, according to a semiconductor laser having an active layer which is 200 Å or less in thickness and a quantum-well structure comprising a plurality of quantum-well layers and a plurality of barrier layers, an impurity, such as zinc (Zn) or silicon (Si), is diffused in the quantum-well structure and atoms constituting the well layers and barrier layers are mixed and disordered, whereby an effective bandgap energy of the quantum-well structure is equalized with that of the barrier layer and made higher than the effective bandgap energy of the quantum-well structure layer which is not disordered. Consequently, the window structure layer which is transparent to the laser light is provided at the disordered part, whereby the facet destruction at the time of high-output operation of the laser is prevented and the high-output operation becomes possible.

In addition, as described above, the $In_{0.5}Ga_{0.5}P$ layer constituting the active layer has a quantum effect in which In and Ga are alternatingly laminated in a state where the crystal growth thereof is normally performed, which is called a natural superlattice. When the natural superlattice is disordered by Zn as described above, its bandgap energy is increased.

According to the above-described conventional InGaP/InAlGaP system semiconductor laser producing laser light in the 0.67 μm band, the carrier concentration of the p-$(Al_{0.7}Ga_{0.3})_{0.5}In_{0.5}P$ cladding layer 4 of the conventional semiconductor laser is approximately $8\times10^{17}$ cm$^{-3}$ at most. According to a doping method for the p-$(Al_{0.7}Ga_{0.3})_{0.5}In_{0.5}P$ cladding layer 4 in the manufacturing steps of the conventional laser, gas of a dopant material (Zn, Si, or the like) is allowed to flow together with a raw material gas, such as Al, Ga, In, and P, which constitutes the layer, to be taken into the crystal. However, the doping amount during crystal growth is limited according to the kind of the crystal, and the p carrier concentration of the p-$(Al_{0.7}Ga_{0.3})_{0.5}In_{0.5}P$ cladding layer is approximately $8\times10^{17}$ cm$^{-3}$ at most. According to an experiment performed by inventors of the present invention, a carrier concentration for a ratio of DMZn flow rate to a III group raw material gas flow rate was approximately $5\times10^{17}$ cm$^{-3}$ at the highest as shown in FIG. 13 and the activation ratio of the carriers was limited to 90% at most. In addition, according to this experiment, the impurity concentration in the actual layer was $5\times10^{17}$ cm$^{-3}$/0.9=5.56$\times10^{17}$ cm$^{-3}$ and it is supposed that the above value $8\times10^{17}$ cm$^{-3}$ is not included.

As described referring to FIGS. 12(g) and 12(h), it is possible that the ridge-etching mask 16a is removed to form the impurity diffusion source film 7 at the ridge after crystal growth and ridge etching, whereby the impurity diffusion is performed at the ridge. In this case, however, the number of steps is increased and it is necessary to align the impurity diffusion source film with the ridge when the impurity diffusion source film is formed. Consequently, the steps become complicated and its precision can not be high.

As a result, for example, as compared with the 0.78 μm band AlGaAs/GaAs system semiconductor laser for an optical disc, the element resistance of the conventional 0.67 μm band InGaP/InAlGaP system laser shown in FIG. 11 was increased. Although the semiconductor laser for the optical disc was conventionally used under a high-frequency superposition of 600 MHz, since the element resistance of the 0.67 μm band semiconductor laser of the conventional example is high, only a high-frequency superposition of approximately 100 to 200 MHz is applied thereto, which is a problem in practical use.

In addition, since the conventional semiconductor laser having the window structure is manufactured by introducing the impurities to the facet after the crystal growth process is completed as described above, the manufacturing steps become complicated.

SUMMARY OF THE INVENTION

The present invention was made in order to solve the above problems, and it is an object of the present invention to provide a manufacturing method capable of increasing a p carrier concentration of a p-$(Al_{0.7}Ga_{0.3})_{0.5}In_{0.5}P$ cladding layer in a 0.67 μm band InGaP/InAlGaP system laser, whereby element resistance of the 0.67 μm band InGaP/InAlGaP system laser is reduced, and capable of simply manufacturing a 0.67 μm band semiconductor laser capable of high-frequency superposition at a practical level.

It is another object of the present invention to provide a manufacturing method capable of simply manufacturing a semiconductor laser with a window structure in which high-output operation is possible without generating facet destruction.

It is a further object of the present invention to provide a manufacturing method capable of simply manufacturing a semiconductor laser with a window structure in which a p carrier concentration of the p-$(Al_{0.7}Ga_{0.3})_{0.5}In_{0.5}P$ cladding layer is increased, an element resistance is reduced without degrading a temperature characteristic in a short wavelength region, a high-frequency superposition is possible at a practical level, and high-output operation is possible without generating facet destruction.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of manufacturing a ridge-buried type semiconductor laser having a ridge waveguide structure comprises growing a semiconductor crystal layer comprising at least a first conductivity type lower cladding layer, an active layer, and a second conductivity type upper cladding layer on a semiconductor substrate; forming a stripe-shaped impurity diffusion source film comprising atoms serving as second conductivity type dopant when diffused into the upper cladding layer, at a striped region which becomes a top of a ridge on the semiconductor crystal layer; ridge-etching the semiconductor crystal layer using a ridge etching mask including the impurity diffusion film so that the second conductivity type upper cladding layer has the striped ridge; growing a first conductivity type current blocking layer on both sides of the ridge so as to bury the ridge; and forming a high-concentration layer comprising a second conductivity type impurity in the second conductivity type upper cladding layer of the ridge region by diffusing atoms serving as the second conductivity type dopant from the impurity diffusion source film patterned into a form a stripe by heat treatment into the upper cladding layer. Thus, as compared with the conventional example, the InGaAsP upper cladding layer having a high p-type impurity concentration is obtained by a simple method. Consequently, there is provided a 0.67 μm band InGaP/InAlGaP system semiconductor laser in which the element resistance is significantly reduced, high-frequency superposition is possible at a practical level, and a characteristic at the time of the high-frequency superposition is significantly improved.

According to a second aspect of the present invention, in the above-described manufacturing method of a semiconductor laser, the impurity diffusion source film comprises a material whose atoms of component material serve as second conductivity type dopant when diffused into the second conductivity type upper cladding layer.

According to a third aspect of the present invention, in the above-described manufacturing method of a semiconductor laser, the impurity diffusion source film comprises impurities serving as a second conductivity type dopant when diffused into the lower second conductivity type upper cladding layer.

According to a fourth aspect of the present invention, in the above-described manufacturing method of a semiconductor laser, since a concentration of impurities diffused into the lower layer is controlled by controlling the quantity of impurities in the impurity diffusion source film, the concentration of a diffused region is controlled with high precision.

According to a fifth aspect of the present invention, in the above-described manufacturing method of the semiconductor laser, since the striped ridge further includes a second conductivity type first contact layer disposed on the second conductivity type upper cladding layer, the impurities are diffused into the second conductivity type upper cladding layer through the second conductivity type first contact layer to form a diffused region.

According to a sixth aspect of the present invention, in the above-described manufacturing method of a semiconductor laser, since only the impurity diffusion source film serves as the ridge-etching mask, the manufacturing steps are simplified.

According to a seventh aspect of the present invention, in the above-described manufacturing method of a semiconductor laser, the ridge-etching mask comprises a film serving as a selective growth mask at the time of growth of the current blocking layer formed on the impurity diffusion source film, and the film serving as the selective growth mask and the impurity diffusion source film are removed after the ridge-etching but before the growth of the second conductivity type second contact layer thereon. Therefore, even when the impurity diffusion source film does not serve as the selective growth mask, the selective growth is precisely performed.

According to an eighth aspect of the present invention, in the above-described manufacturing method of a semiconductor laser, the above-described diffusion is performed by heat generated at the time of buried-growth of the first conductivity type current blocking layer. Therefore, the high-concentration diffused region is formed in the second conductivity type upper cladding layer at the time of the growth of the current blocking layer, for example, at 500° C. for thirty minutes.

According to a ninth aspect of the present invention, the above-described manufacturing method of the semiconductor laser further comprises growing a second conductivity type second contact layer on the whole surface of the ridge and on the first conductivity type current blocking layer buried on each side thereof, after the first conductivity type current blocking layer is buried and grown. The diffusion is performed by heat at the time of buried-growth of the first conductivity type current blocking layer and by heat at the time of crystal growth of the second contact layer. Consequently, the high-concentration diffused region is formed in the second conductivity type upper cladding layer by crystal growth of the second contact layer, for example, at 500° C. for approximately 30 minutes, in addition to growth of the current blocking layer at 500° C. for approximately 30 minutes.

According to a tenth aspect of the present invention, in the above-described manufacturing method of a semiconductor laser, since the diffusion is performed by heat at the time of the buried-growth of the first conductivity type current blocking layer and by heat at the time of crystal growth of the second contact layer and further performed by annealing after the crystal growth is completed, the high-concentration diffused region is formed in the second conductivity type upper cladding layer by annealing, for example, at 500° C. for approximately 30 minutes, in addition to the heat of the buried-growth of the current blocking layer at 500° C. for approximately 30 minutes and the heat of crystal growth of the second contact layer at 500° C. for approximately one hour.

According to an eleventh aspect of the present invention, in the above-described manufacturing method of a semiconductor laser, the degree of diffusion of impurities from the impurity diffusion source film into the upper cladding layer by the heat at the time of crystal growth of the current blocking layer and by the heat at the time of crystal growth of the contact layer is observed from a part of a section of a wafer after the crystal growth is completed, and annealing is performed for an insufficient amount of diffusion. Therefore, an annealing time after the buried-growth of the current blocking layer and crystal growth of the second contact layer is appropriately set.

According to a twelfth aspect of the present invention, in the above-described manufacturing method of a semiconductor laser, the semiconductor substrate is an n type GaAs substrate, the first conductivity type lower cladding layer is an n-$(Al_{0.7}Ga_{0.3})_{0.5}In_{0.5}P$ lower cladding layer, the active layer is an $In_{0.5}Ga_{0.5}P$ active layer, the second conductivity type upper cladding layer is a p-$(Al_{0.7}Ga_{0.3})_{0.5}In_{0.5}P$ upper cladding layer, the second conductivity type first contact layer is a p-GaAs first contact layer, and the second conductivity type contact layer is a p-GaAs second contact layer. Therefore, the element resistance is significantly reduced and a characteristic at the time of the high-frequency superposition is significantly improved in a short-wavelength InGaAlP visible light laser diode of the described structure.

According to a thirteenth aspect of the present invention, since the active layer has a multi-quantum well structure comprising a plurality of $Ga_{0.5}In_{0.5}P$ quantum-well layers and a plurality of $(Al_{0.5}Ga_{0.5})_{0.5}In_{0.5}P$ quantum-barrier layers, a characteristic at the time of high-frequency superposition is improved.

According to a fourteenth aspect of the present invention, since the active layer comprises an $In_{0.5}Ga_{0.5}P$ natural superlattice, a characteristic at the time of high-frequency superposition is improved.

According to a fifteenth aspect of the present invention, a manufacturing method of a ridge-buried type semiconductor laser comprises growing a semiconductor crystal layer comprising at least a first conductivity type lower cladding layer, an active layer of a quantum-well structure, and a second conductivity type upper cladding layer on a semiconductor substrate; forming a second impurity diffusion source film having a stripe pattern and comprising atoms serving as a second conductivity type dopant when diffused into the upper cladding layer, at a region where a window structure is to be formed in a striped region which becomes a top of a ridge on the semiconductor crystal layer; ridge-etching the semiconductor crystal layer using a ridge-etching mask partially comprising the second impurity diffusion film and formed along the striped region so that the second conductivity type upper cladding layer may have the striped ridge; growing a first conductivity type current blocking layer on both sides of the ridge so as to bury the ridge; and forming the window structure by diffusing atoms serving as the second conductivity type dopant from the second impurity diffusion source film that is formed at a region where the window structure is to be formed in the ridge striped region into the active layer of the quantum-well structure through the upper cladding layer by heat treatment to disorder the quantum-well structure of the active layer in the diffused region. Consequently, there is provided a semiconductor laser having the window structure and capable of high-output operation without facet destruction.

According to a sixteenth aspect of the present invention, in the above-described manufacturing method of a semiconductor laser, a method of patterning the second impurity diffusion source film comprises forming the second impurity diffusion source film on the whole surface of a crystal-grown wafer and patterning it into a stripe along a region corresponding to a window region in the laser; forming a ridge-etching mask thereon and patterning it into the stripe along a ridge to be formed in the laser; and forming two rectangular impurity diffusion source films by etching away an exposed part of the striped second impurity diffusion source film along the region where the window structure is to be formed in the laser using the ridge-etching mask. Consequently, the impurity diffusion source film required for forming the window structure is easily patterned.

According to a seventeenth aspect of the present invention, a manufacturing method of a ridge-buried type semiconductor laser comprises growing a semiconductor crystal layer comprising at least a first conductivity type lower cladding layer, an active layer of a quantum-well structure and a second conductivity type upper cladding layer on a semiconductor substrate; forming an impurity diffusion source film pattern on a striped region where a ridge is to be formed, which pattern consists of a second impurity diffusion source film comprising atoms serving a second conductivity type dopant when diffused into the cladding layer at a region where a window structure is to be formed in the striped region which becomes a top of the ridge later on, and a first impurity diffusion source film comprising atoms serving as a second conductivity type dopant when diffused into the cladding layer at the striped region which becomes the top of the ridge later on; ridge-etching the semiconductor crystal layer using a ridge-etching mask formed along the striped region comprising the impurity diffusion source film so that the second conductivity type upper cladding layer may have the striped ridge; forming a first conductivity type current blocking layer at each side of the ridge so as to bury the ridge; forming a window structure by diffusing atoms serving as second conductivity type dopant from the second impurity diffusion film formed at the region where the window structure is to be formed in the ridge-striped region in the active layer of the quantum-well structure through the upper cladding layer by heat treatment to disorder the active layer of the quantum-well structure in the diffused region in the active layer, and forming a high-concentration layer comprising a second conductivity type impurity in the second conductivity type upper cladding layer at the ridge by diffusing atoms serving as the second conductivity type dopant from the first impurity diffusion source film into the upper cladding layer. Consequently, there is provided a 0.67 µm band InGaP/InAlGaP system semiconductor laser in which the element resistance is significantly reduced, high-frequency superposition is possible at a practical level, a characteristic at the time of the high-frequency superposition is significantly improved, and high-output operation is possible without facet destruction.

According to an eighteenth aspect of the present invention, in the above-described manufacturing method of a semiconductor laser, the first and second impurity diffusion source films are formed by forming a diffusion-through film, in which an amount of diffusion is reduced, on the ridge striped region other than a region where the window structure is to be formed, and then forming the impurity diffusion source film having a desired thickness on the whole surface of the ridge striped region.

According to a nineteenth aspect of the present invention, in the above-described manufacturing method of a semiconductor laser, the diffusion-through film is formed by a plasma CVD method, the impurity diffusion source film is formed by sputtering, and the selective growth mask is formed by CVD.

According to a twentieth aspect of the present invention, in the above-described manufacturing method of a semiconductor laser, the first and second impurity diffusion source films are formed by forming the second impurity diffusion source film at a region where the window structure is to be formed on the ridge striped region and then, forming the first impurity diffusion source film having a desired thickness on the whole surface of the ridge striped region.

According to a twenty-first aspect of the present invention, the above-described manufacturing method of a semiconductor laser includes patterning of the first and second impurity diffusion source films forming a film comprising a material of the second impurity diffusion source film on the whole surface of the crystal-grown wafer and patterning it into a stripe along the region corresponding to the window structure of the laser; patterning a mask comprising a material of the first impurity diffusion source film, into a stripe along the region where the ridge is to be formed in the laser; and etching away an exposed part of the striped second impurity diffusion source film along the region of the window structure to be formed in the laser using the striped first impurity diffusion source film as a mask.

According to a twenty-second aspect of the present invention, the above-described manufacturing method of a semiconductor laser includes patterning of the first and second impurity diffusion source films forming a film comprising a material of the second impurity diffusion source film on the whole surface of the crystal-grown wafer and patterning the film into a stripe along the region corresponding to the window structure of the laser; forming a mask comprising a material of the first impurity diffusion source film on the whole surface; and patterning a mask comprising a material of the striped second impurity diffusion source film along the region where the window structure is to be formed and the first impurity diffusion source film covering the second impurity diffusion source film, into a stripe along the region where the ridge is to be formed in the laser.

BRIEF DESCRIPTION OF THE DRAWING

FIG. 26 is a list showing material parameters used in the calculation for FIG. 17 and other figures shown later.

DESCRIPTION OF PREFERRED EMBODIMENTS

Embodiment 1

Figure 1:
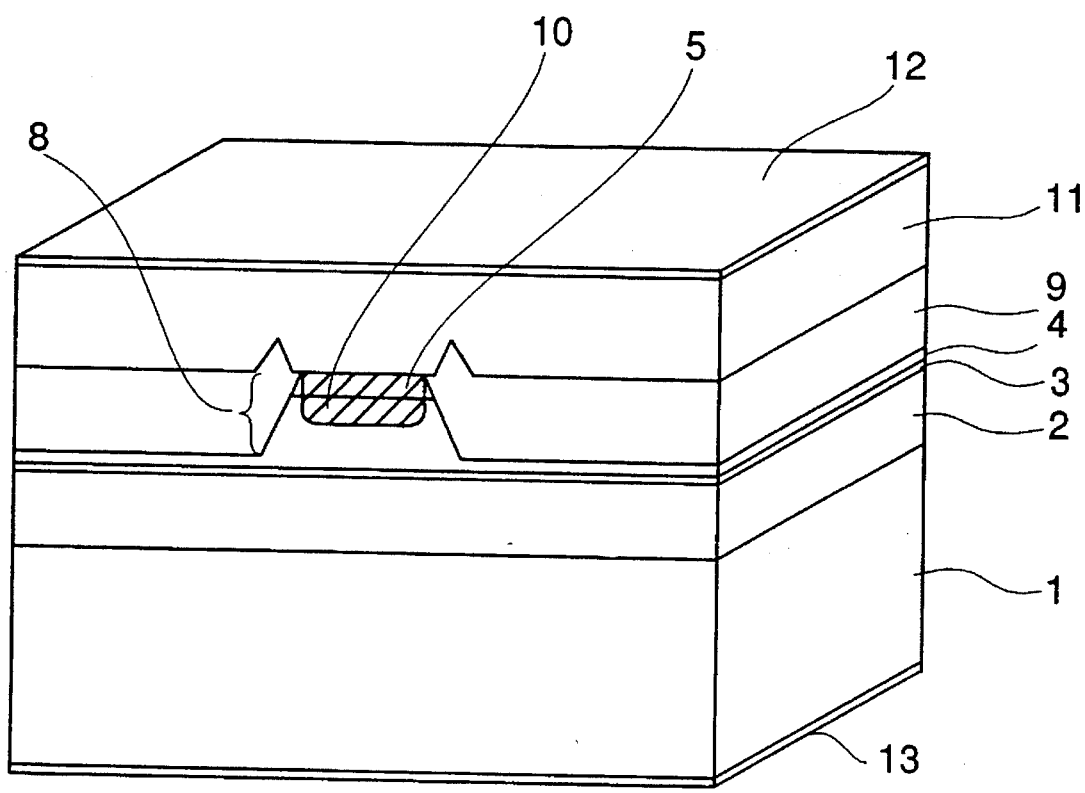
FIG. 1 is a perspective view showing a structure of a semiconductor laser manufactured by a manufacturing method of a semiconductor laser according to a first embodiment of the present invention.

FIG. 1 is a schematic view showing a 0.67 μm band InGaP/InAlGaP semiconductor laser which is manufactured by a manufacturing method of a semiconductor laser according to a first embodiment of the present invention.

In FIG. 1, an n-$(Al_{0.7}Ga_{0.3})_{0.5}In_{0.5}P$ cladding layer 2 having an impurity concentration of $1\times10^{17}$ cm$^{-3}$ and a thickness of 1.5 μm is disposed on an n-GaAs semiconductor substrate 1 having an impurity concentration of 1 to $3\times10^{18}$ cm$^{-3}$ and a thickness of 95 μm. An undoped $In_{0.5}Ga_{0.5}P$ active layer 3 having a thickness of 0.07 μm is disposed on the n-$(Al_{0.7}Ga_{0.3})_{0.5}In_{0.5}P$ cladding layer 2. A p-$(Al_{0.7}Ga_{0.3})_{0.5}In_{0.5}P$ upper cladding layer 4 having a prescribed impurity concentration that will be described later (the impurity is Zn or Si) and a thickness of 0.25 μm is disposed on the $In_{0.5}Ga_{0.5}P$ active layer 3. A p-GaAs first contact layer 5 having an impurity concentration of $2\times10^{19}$ cm$^{-3}$ and a thickness of 0.4 μm is disposed on a ridge 4a of the p-$(Al_{0.7}Ga_{0.3})_{0.5}In_{0.5}P$ upper cladding layer 4. The ridge 4a is 5.5 μm wide at the bottom and 3.0 μm wide at the upper part. An n-GaAs current blocking layer 9 having an impurity concentration of $6\times10^{18}$ cm$^{-3}$ and a thickness of 1 μm is disposed on a thin film portion 4b of the p-$(Al_{0.7}Ga_{0.3})_{0.5}In_{0.5}P$ upper cladding layer 4. A p-GaAs second contact layer 11 having an impurity concentration of $2\times10^{19}$ cm$^{-3}$ and a thickness of 2.5 μm is disposed on the p-GaAs first contact layer 5 and on the n-GaAs current blocking layer 9. In addition, a p-side electrode 12 comprising Ti/Pt/Au is disposed on the p-GaAs second contact layer 11, and an n-side electrode 13 comprising AuGe/Ni/Ti/Au is disposed on the p-GaAs semiconductor substrate 1. The height of the laser, except for the electrodes, is 100 μm.

FIGS. 2(a)–2(f) show a manufacturing method of the 0.67 μm band InGaP/InAlGaP group semiconductor laser according to the first embodiment of the present invention shown in FIG. 1. In the figures, reference numeral 6 designates an impurity diffusion source film formed on the whole surface of the first contact layer 5. Reference numeral 6a designates a stripe-shaped impurity diffusion source film formed by patterning the impurity diffusion source film 6 to leave a portion on a ridge portion to be formed. In addition, reference numeral 8 designates a ridge formed by etching away a part of the p-$(Al_{0.7}Ga_{0.3})_{0.5}In_{0.5}P$ cladding layer 4 and a desired region of the p-GaAs first contact layer 5. A GaAs current blocking layer 9 is formed by buried-growth on each side of the ridge 8, and an impurity diffused region 10 is formed in the lower p-GaAs first contact layer 5 and the p-$(Al_{0.7}Ga_{0.3})_{0.5}In_{0.5}P$ upper cladding layer 4 by diffusion of impurities from the impurity diffusion source film 6a into both layers 5 and 4.

Next, the manufacturing method of the semiconductor laser of the first embodiment will be described in reference to FIGS. 2(a)–2(f).

First, the n-$(Al_{0.7}Ga_{0.3})_{0.5}In_{0.5}P$ cladding layer 2, the $In_{0.5}Ga_{0.5}P$ active layer 3, the p-$(Al_{0.7}Ga_{0.3})_{0.5}In_{0.5}P$ cladding layer 4, and the p-GaAs first contact layer 5 are epitaxially grown on the n-GaAs semiconductor substrate 1 by MOCVD.

Then, the impurity diffusion source film 6 is formed on the whole surface of the wafer as shown in FIG. 2(b). A component of the impurity diffusion source film 6 is diffused into the p-GaAs first contact layer 5 and into the p-$(Al_{0.7}Ga_{0.3})_{0.5}In_{0.5}P$ cladding layer 4 as a p-type dopant. Such a film comprises ZnO, CdO, MgO, or the like. In this case, Zn, Cd, or Mg, respectively is diffused into the p-GaAs first contact layer 5 and the p-$(Al_{0.7}Ga_{0.3})_{0.5}In_{0.5}P$ cladding layer 4 as p type dopant. The film 6 comprising ZnO, CdO, MgO, or the like is formed by sputtering.

Then, the impurity diffusion source film 6 is patterned using a photoresist as a mask to form the stripe-shaped film 6a as shown in FIG. 2(c). The width of the stripe is appropriately 5 to 15 µm.

Then, ridge-etching is performed using the impurity diffusion source film 6a as it is as a ridge-etching mask. More specifically, as shown in FIG. 2(d), etching is performed for approximately 5 minutes using the impurity diffusion source film 6a as a mask to form the ridge 8. During the etching, the p-GaAs first contact layer 5 and the p-$(Al_{0.7}Ga_{0.3})_{0.5}In_{0.5}P$ cladding layer 4 are etched away (the thickness of the layer 4 left is 0.3 µm) to form the ridge 8. FIG. 2(d) shows a sectional view after the etching.

Then, as shown in FIG. 2(e), recrystallization growth is performed in which the n-GaAs current blocking layer 9 having an impurity concentration of $6\times10^{18}$ $cm^{-3}$ and a thickness of 1 µm is grown around and buries the ridge 8. At this time, since the impurity diffusion source film 6a serves as a selective growth mask at the time of crystal growth on the ridge 8, there is no crystal growth thereon. The wafer is heated at 500° C. or more for approximately 30 minutes at the time of crystal growth, so that the impurities are diffused from the impurity diffusion source film 6a into the p-GaAs first contact layer 5 and the p-$(Al_{0.7}Ga_{0.3})_{0.5}In_{0.5}P$ cladding layer 4, whereby the p type impurity diffused region 10 is formed.

Then, as shown in FIG. 2(f), the impurity diffusion source film 6a is removed by wet or dry etching and then, the crystal growth of the p-GaAs second contact layer 11 is performed. Then, the n-side electrode 13 comprising AuGe/Ni/Ti/Au and the p-side electrode 12 comprising Ti/Pt/Au are formed on the n-GaAs substrate 1 and the p-GaAs second contact layer 11, respectively, by vapor deposition using resistance heating, EB (electron beam) deposition, or sputtering, whereby the semiconductor laser shown in FIG. 1 is completed.

While the p carrier concentration in the p-$(Al_{0.7}Ga_{0.3})_{0.5}In_{0.5}P$ cladding layer 4 by the conventional doping at the time of epitaxial growth is limited to $8\times10^{17}$ $cm^{-3}$ according to the manufacturing method of the semiconductor laser of the first embodiment of the present invention, since the p-type impurities are diffused from the impurity diffusion source 6a into the first contact layer 5 and the p type $(Al_{0.7}Ga_{0.3})_{0.5}In_{0.5}P$ cladding layer 4 during epitaxial growth of the current blocking layer 9 and the diffused region 10 is formed, the carrier concentration in the p type $(Al_{0.7}Ga_{0.3})_{0.5}In_{0.5}P$ cladding layer 4 is 1 to $2\times10^{18}$ $cm^{-3}$ or more. Consequently, the sheet resistance of the p-cladding layer 4 is significantly reduced, whereby the resistance of the laser is significantly reduced.

Thus, according to the manufacturing method of the semiconductor laser of the first embodiment, in the method of forming the ridge-buried type semiconductor laser having a ridge waveguide, a film serving as an impurity diffusion source is used as a ridge mask, i.e., a mask for ridge-etching at the time of ridge-etching and, after the ridge-etching, the impurities are diffused from the impurity diffusion source film to the p-contact layer and to the middle of the p-cladding layer by heat at the time of buried-growth of the current blocking layer. Consequently, the impurity serves as p type dopant in the lower crystal layer, so that the carrier concentration in the p-cladding layer is effectively increased, whereby the element resistance of the laser is significantly reduced. Therefore, characteristics of the 0.67 µm band InP system semiconductor laser at the time of high-frequency superposition are improved.

Figure 12:
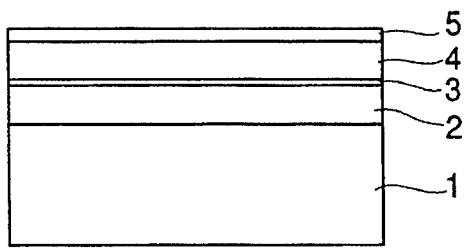
FIGS. 12(a)–12(h) are views showing process steps in a manufacturing method of the conventional 0.67 μm band semiconductor laser.
Figure 12:
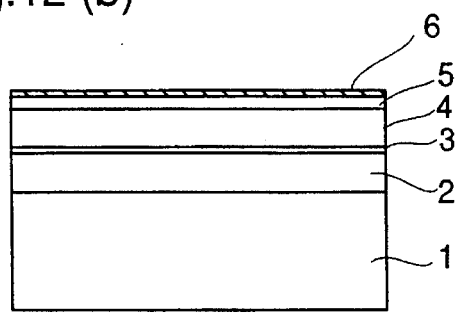
Figure 12:
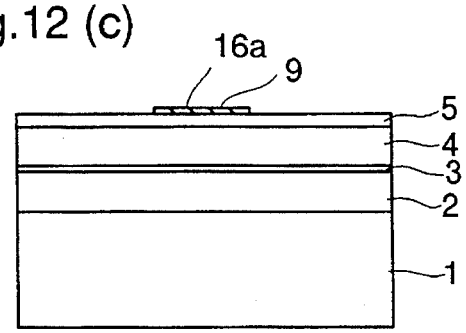
Figure 12:
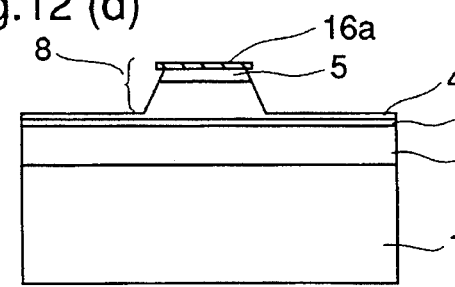
Figure 12:
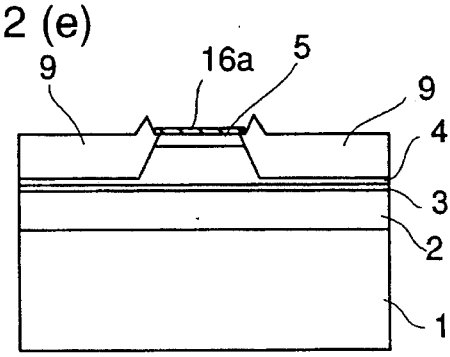
Figure 12:
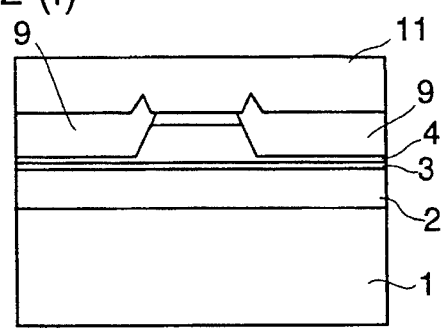
Figure 12:
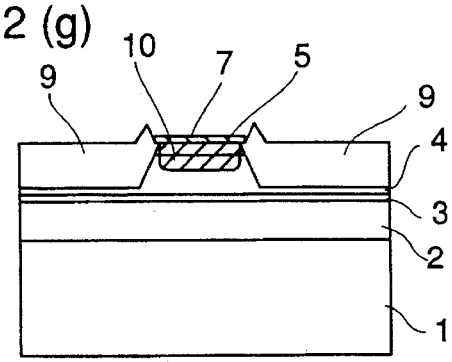
Figure 12:
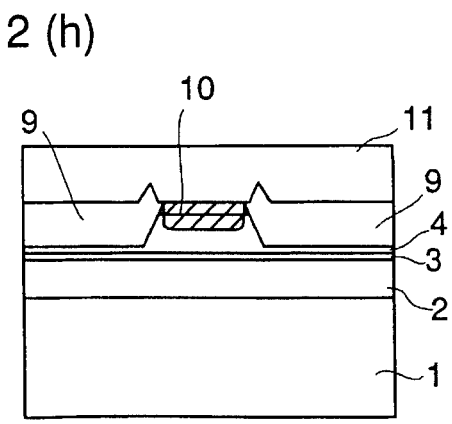
Figure 13:
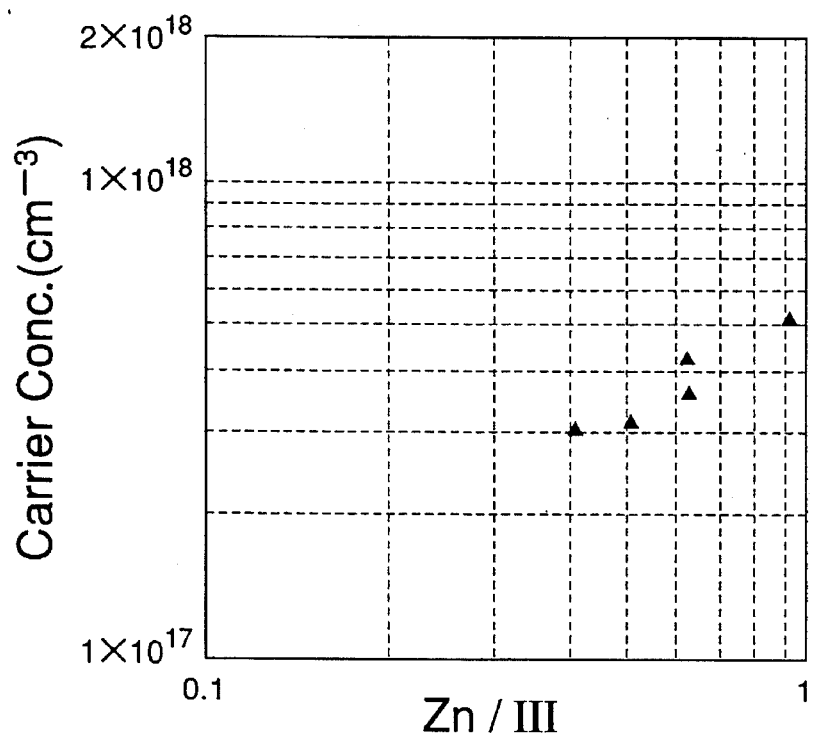
FIG. 13 is a graph showing carrier concentration versus to a ratio of DMZn flow rate to III group raw material gas flow rate according to a result of an experiment performed by inventors of the present invention for describing a conventional problem.
Figure 14:
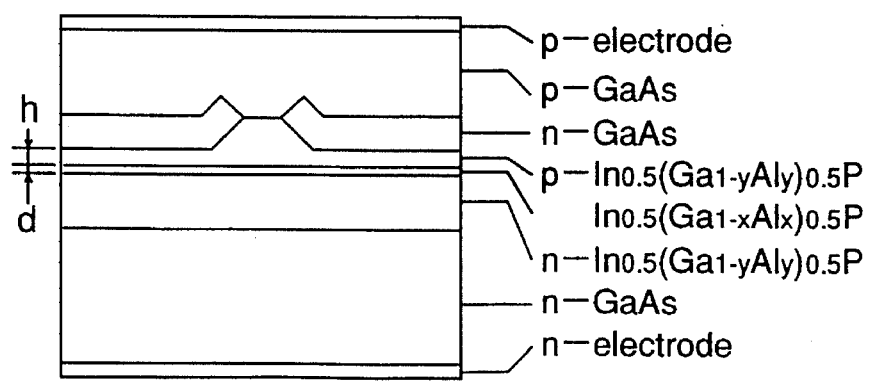
FIG. 14 is a view showing a representative structure of a transverse-mode stabilized InGaAlP laser.
Figure 15:
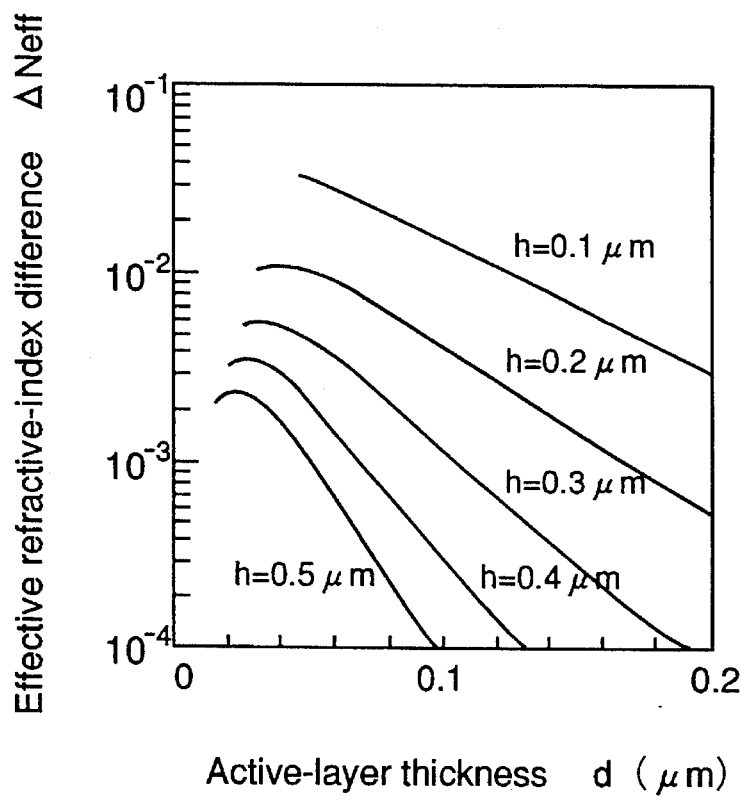
FIG. 15 is a graph showing a calculation example of ΔNeff as a function of d and h in a case of an InGaAlP active layer and an $In_{0.5}(Ga_{0.3}Al_{0.7})_{0.5}P$ cladding layer.
Figure 16:
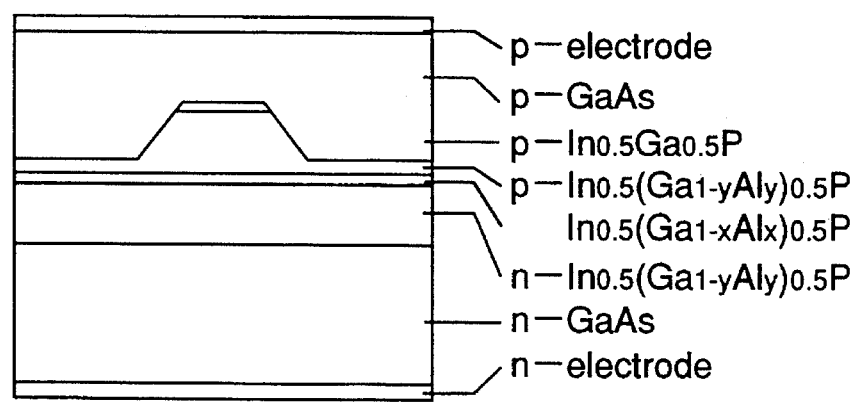
FIG. 16 is a view showing another structure of the transverse-mode stabilized InGaAlP laser.
Figure 17:
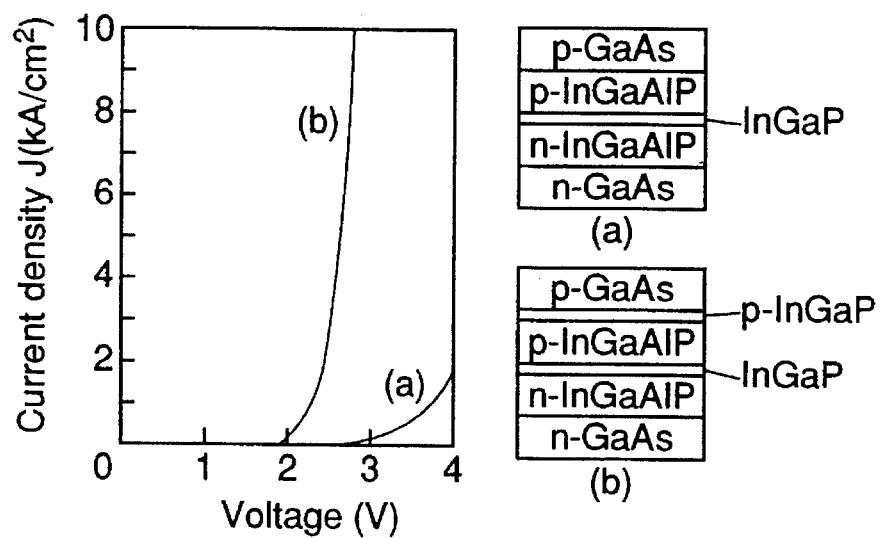
FIG. 17 is a view for explaining a principle and a structure of a current confining mechanism of an HBB laser.
Figure 18:
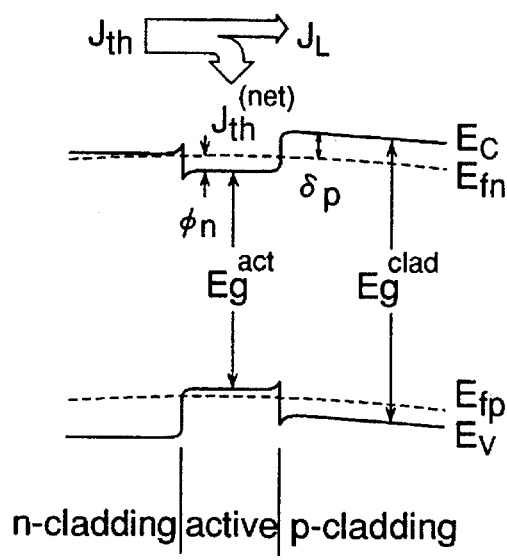
FIG. 18 is a view showing a schematic band diagram of a laser having an InGaAlP double-hetero structure at an oscillation threshold value.
Figure 19:
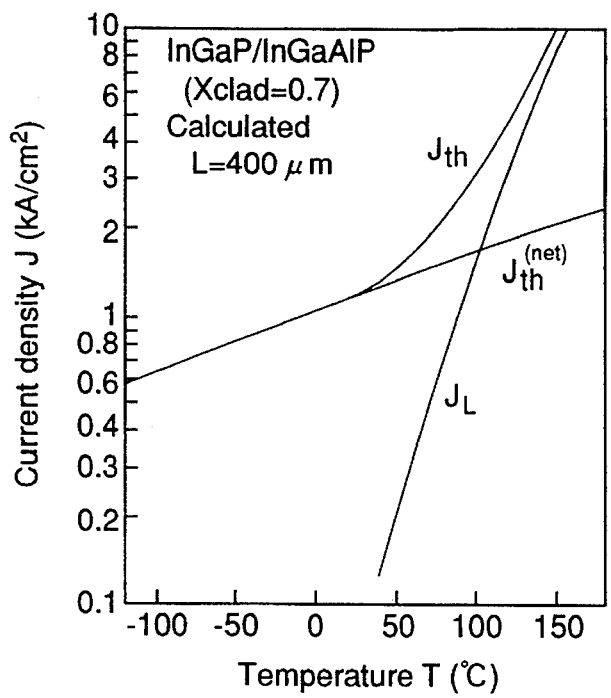
FIG. 19 is a graph showing a calculation example of the temperature dependency of threshold current density of an $InGaAlP-In_{0.5}(Ga_{0.3}Al_{0.7})_{0.5}P$ double-hetero structure.
Figure 20:
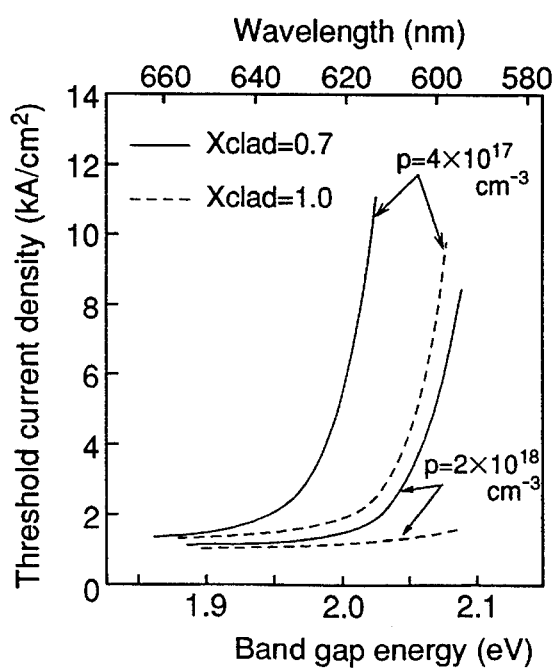
FIG. 20 is a graph showing a curve corresponding to experiment data of a laser diode having an $In_{0.5}(Ga_{0.3}Al_{0.7})_{0.5}P$ cladding layer having a concentration of holes of $4\times10^{17}$ cm$^{-3}$.
Figure 21:
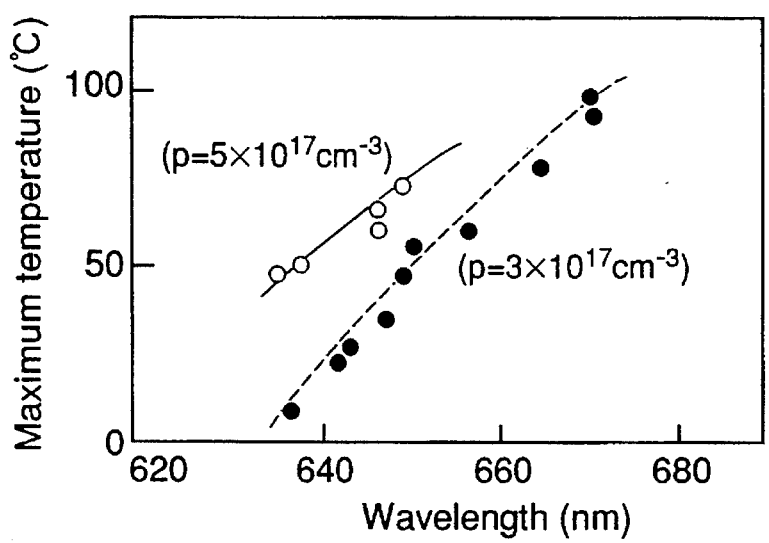
FIG. 21 is a graph showing an experiment result showing a relationship between oscillation wavelength and maximum temperature during a continuous wave operation of the InGaAlP laser.
Figure 22:
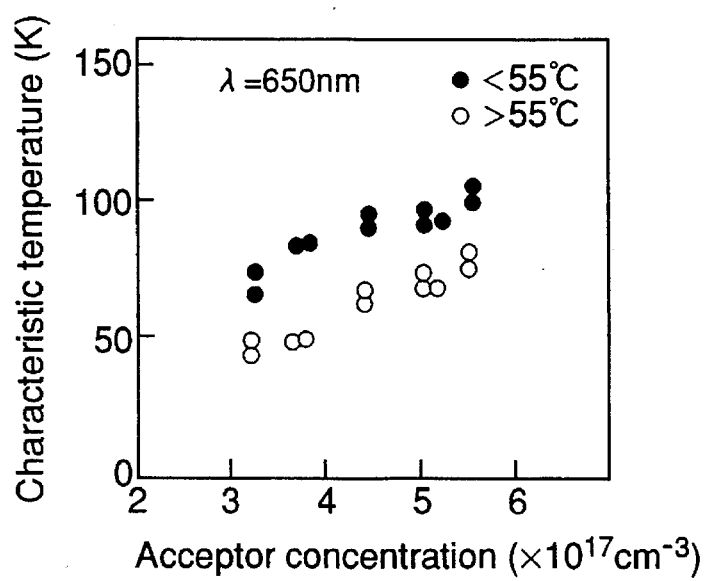
FIG. 22 is a graph showing a characteristic temperature of an SBR laser having a wavelength of 650 nm, plotted as a function of acceptor concentration.
Figure 23:
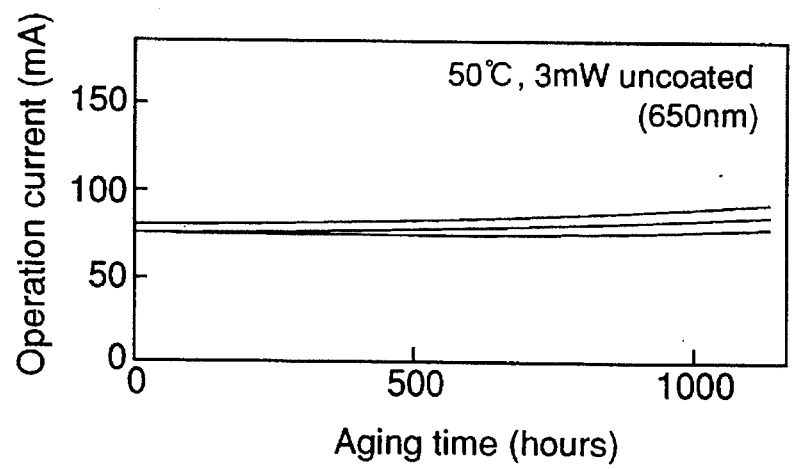
FIG. 23 is a graph showing an example of a result of an aging test of a laser operating at 650 nm without being coated, and at a heat sink temperature of 50° C.
Figure 24:
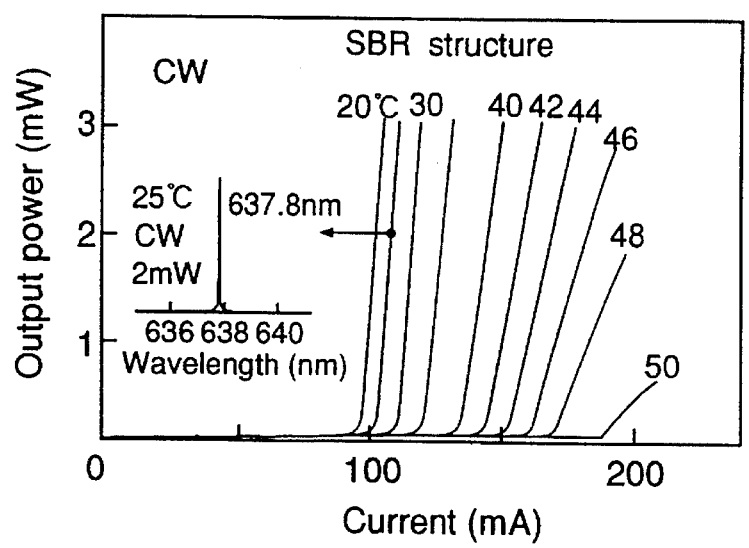
FIG. 24 is a graph showing current versus light output characteristics of a 630 nm band SBR laser.
Figure 25:
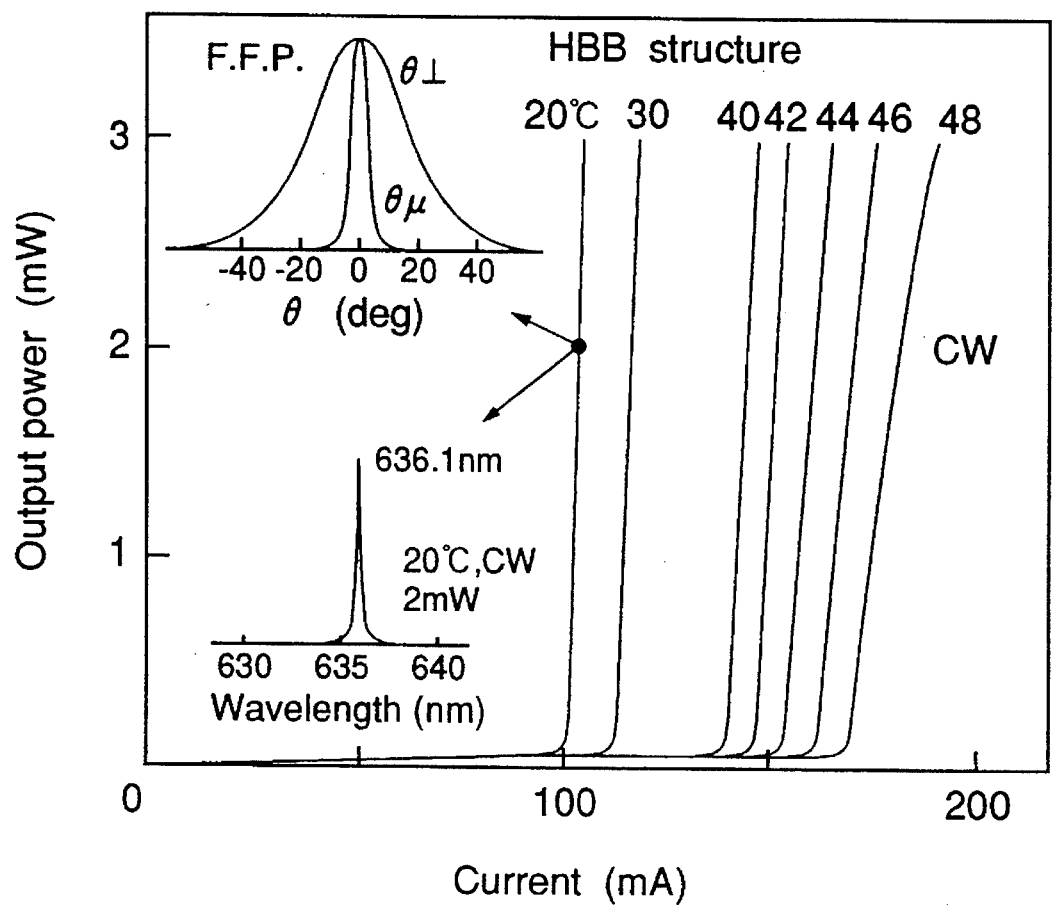
FIG. 25 is a graph showing current versus light output characteristics of a 630 nm band HBB laser.
Figure 27:
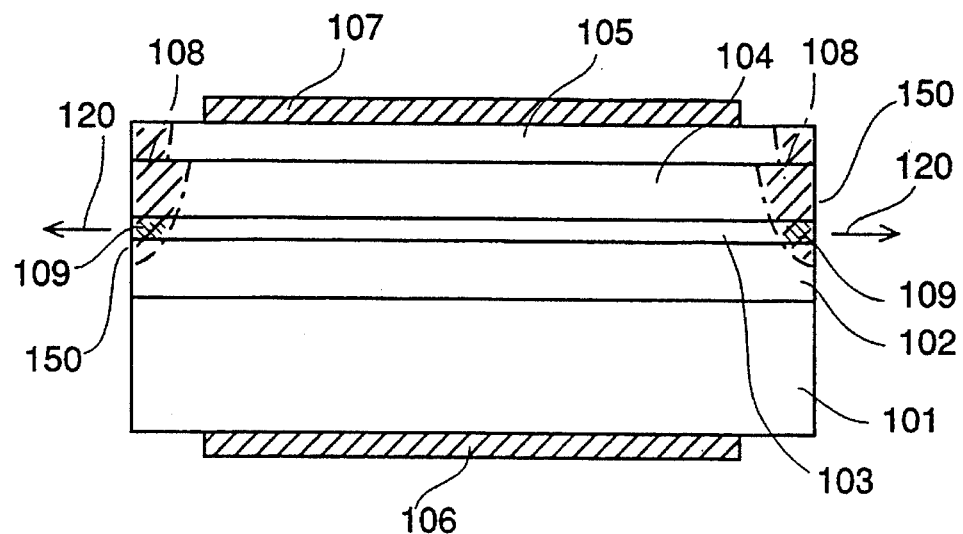
FIG. 27 is a schematic view showing a section along a longitudinal direction of a resonator of a conventional AlGaInP group semiconductor laser having a window structure which is formed using disordering of a natural superlattice.
Figure 28:
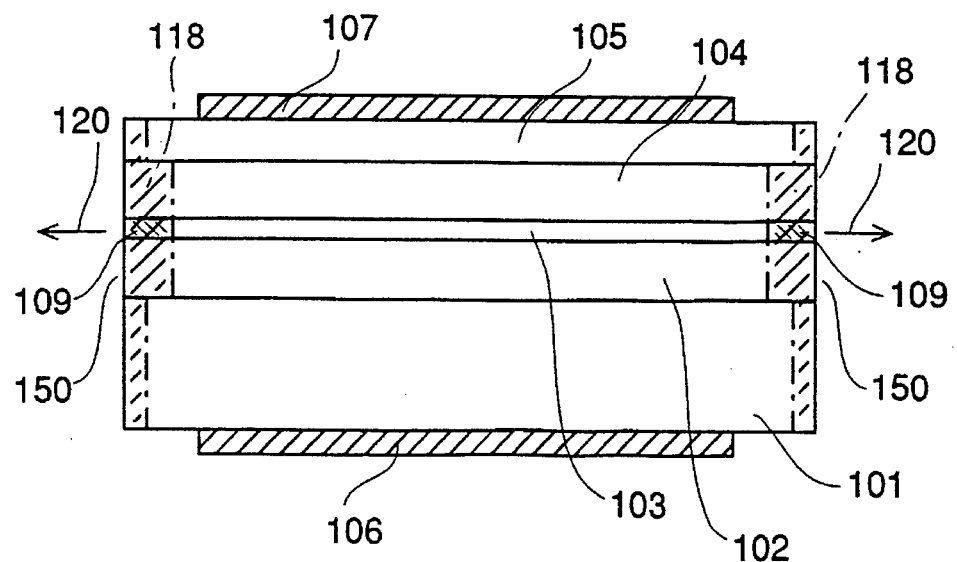
FIG. 28 is a schematic view showing a section along a longitudinal direction of a resonator of a conventional AlGaInP group semiconductor laser having another window structure which is formed using disordering of a natural superlattice.
Figure 29:
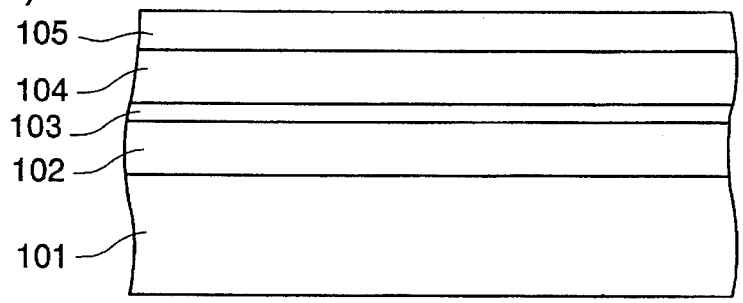
FIGS. 29(a)–29(d) are sectional views illustrating a manufacturing method of the AlGaInP group semiconductor laser having the window structure shown in FIG. 27.
Figure 29:
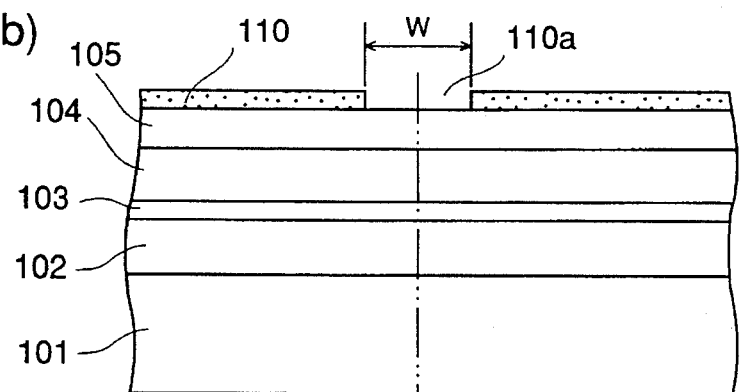
Figure 29:
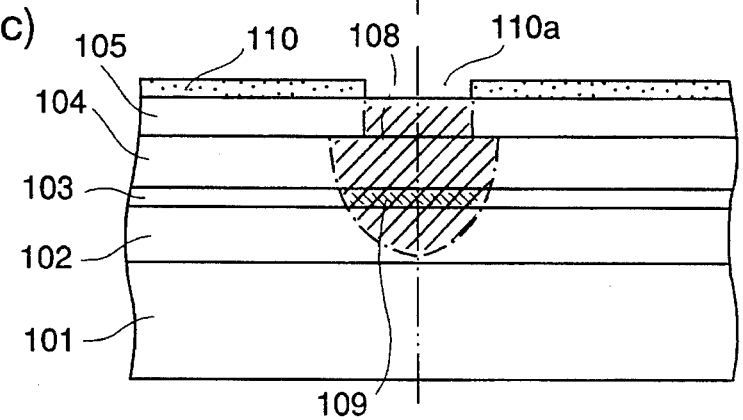
Figure 29:
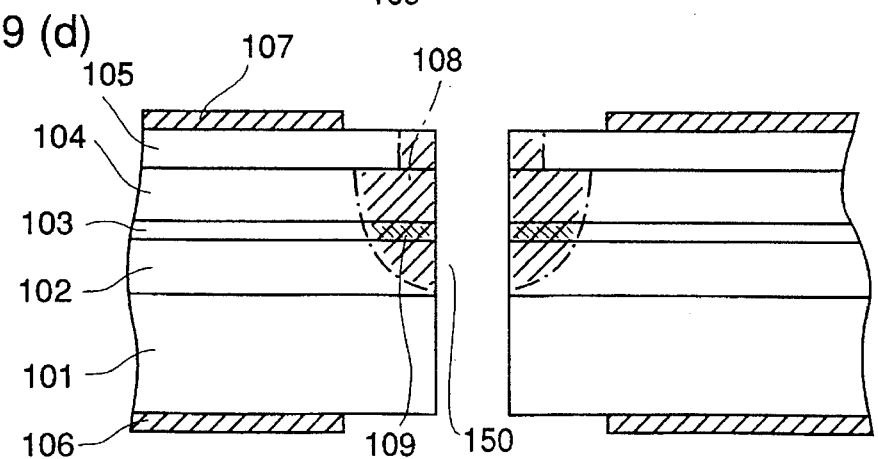
Figure 30:
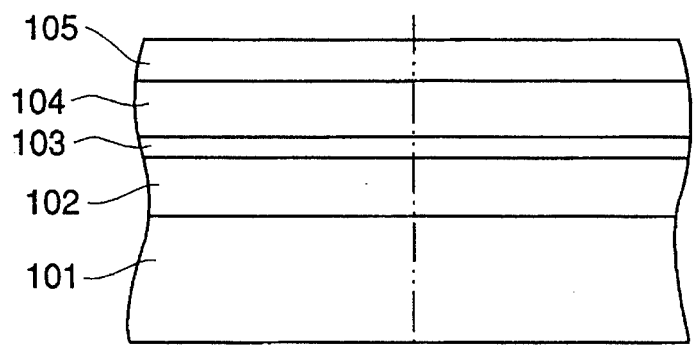
FIGS. 30(a)–30(d) are sectional views illustrating a manufacturing method of the AlGaInP group semiconductor laser having the window structure shown in FIG. 28.
Figure 30:
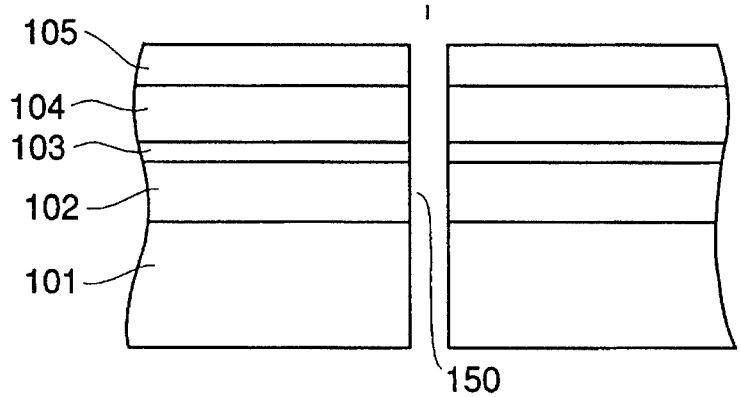
Figure 30:
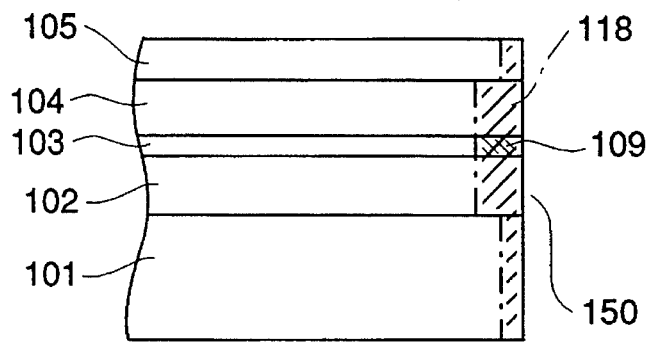
Figure 30:
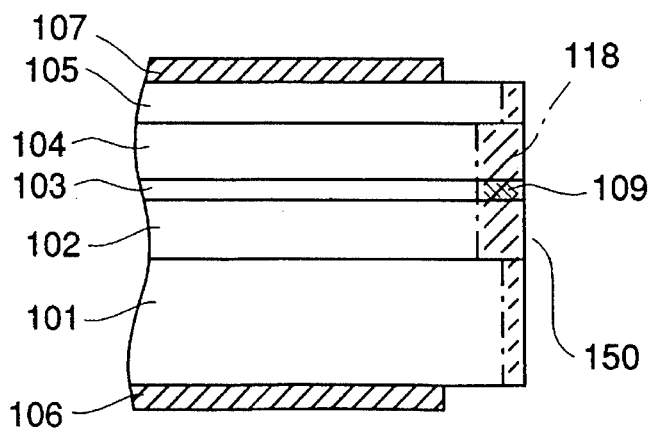

At this time, according to the conventional manufacturing method shown in FIG. 12, after the ridge-etching is performed once using $SiO_2$ or SiN as a mask, the ridge-etching mask is removed and then the impurity diffusion source film is formed on the ridge. Then, the p type impurities are diffused into the p type upper cladding layer. Therefore, the manufacturing process takes time and it is complicated, and mask alignment is necessary with high precision. However, according to the first embodiment, since the impurity diffusion source film is used as the ridge-etching mask and the selective growth mask, it is not necessary to remove the ridge-etching mask once to form the impurity diffusion source film again. Therefore, patterning precision is not required when the impurity diffusion source film is formed and a great effect is attained as compared with the conventional method.

Embodiment 2

In the above-described first embodiment of the present invention, a component of the impurity diffusion source film 6 is diffused into the p-GaAs first contact layer 5 and the p-$(Al_{0.7}Ga_{0.3})_{0.5}In_{0.5}P$ cladding layer 4 to become a p type dopant in each layer in the later process. According to a second embodiment of the present invention, the impurity diffusion source film 6 is a film comprising an impurity which becomes a p type dopant in each layer when diffused into the lower layer in the later process. For example, the film comprises $Al_2O_3$, $SiO_2$, $SiO_3N_4$, SrO or the like doped with Zn, Cd or Mg, or $Al_2O_3$ doped with Si, and it is formed by a thermal CVD method.

According to the second embodiment of the present invention, the same effect as in the first embodiment is obtained.

Embodiment 3

While the impurity diffusion source film 6 is a film comprising an impurity which becomes a p type dopant in each layer when diffused into the lower layer in the later process and, more specifically, the film comprises $Al_2O_3$, $SiO_2$, $SiO_3N_4$, SrO or the like doped with Zn, Cd or Mg, or $Al_2O_3$ doped with Si in the above second embodiment of the present invention, according to a third embodiment of the present invention, when the impurity diffusion source film is used, the concentration of the impurities diffused into the lower layer is controlled by controlling the dopant quantity in the impurity diffusion source film.

More specifically, since the impurity concentration is not especially specified when the impurities are diffused from the impurity diffusion source film 6a in the above second embodiment, even when too many atoms of the impurities are diffused, if they are not activated, they do not act as charge carriers. On the contrary, in this case, crystallinity is degraded and inactive impurities are diffused to the active layer to exert a bad influence on the element characteristics and also on the reliability of the element. For example, when the impurity atoms of a concentration of $5 \times 10^{19}$ cm$^{-3}$ or more are diffused, if they are not activated, the reliability of the element is adversely affected.

Figure 2:
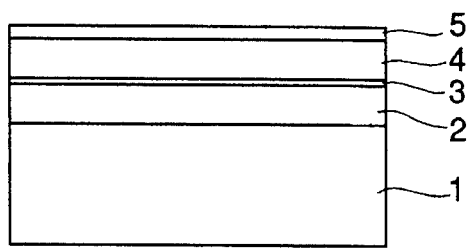
FIGS. 2(a)–2(f) are views showing process steps in the manufacturing method of the semiconductor laser according to the first embodiment of the present invention.
Figure 2:
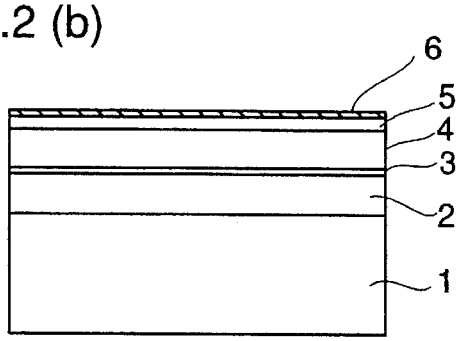
Figure 2:
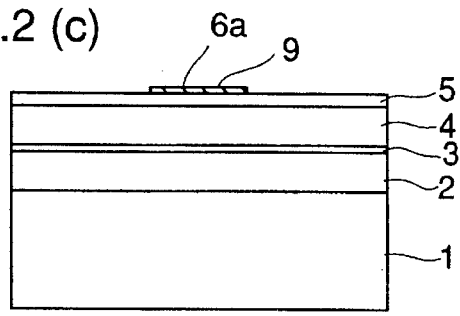
Figure 2:
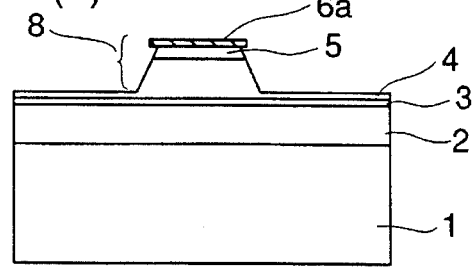
Figure 2:
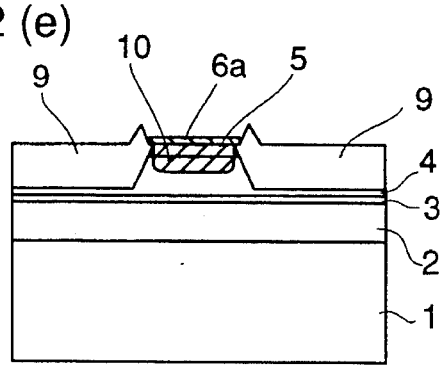
Figure 2:
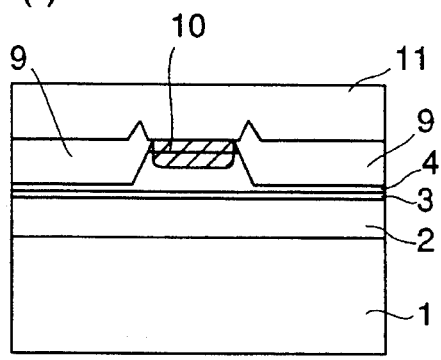

According to the third embodiment of the present invention, similar to the second embodiment, the impurity diffusion source film 6a shown in FIG. 2 is formed by previously doping the impurities to be diffused into a film which does not comprise the impurity to be diffused, and the doping amount in the film at this time is controlled. Consequently, it is possible to control the concentration of the diffused region 10 formed by diffusion of impurities into the p-GaAs first contact layer 5 and the p-$(Al_{0.7}Ga_{0.3})_{0.5}In_{0.5}P$ cladding layer 4. For example, when the impurity diffusion source film is formed of $Al_2O_3$ doped with Zn, the concentration of the impurities diffused into the p-$(Al_{0.7}Ga_{0.3})_{0.5}In_{0.5}P$ cladding layer 4 is controlled. In this case, the impurity amount diffused into the crystal is in proportion to the concentration of Zn in the $Al_2O_3$. For example, it is 1 to $3 \times 10^{18}$ cm$^{-3}$ in a case of $Al_2O_3$ doped with 2 percent by weight of Zn. In this case, a doping method of the impurities into the impurity diffusion source film is as follows, that is, when the impurity diffusion source film is formed by vapor phase growth, a gas including the doping impurity is contained in a raw material gas of a material constituting the film in a desired amount.

According to the manufacturing method of the semiconductor laser of the third embodiment of the present invention, the impurities to be diffused are previously doped in the film which does not comprise the impurity to be diffused and the concentration of the region formed by diffusion is controlled by controlling the doping amount. Consequently, the concentration of the diffused impurities is controlled with high precision.

Embodiment 4

When the impurity diffusion source film 6a according to the first to third embodiments is formed of $SiO_2$ or $Si_3N_4$ doped with impurities, the film serves as a mask when the current blocking layer 9 is regrown. More specifically, since there is no crystal growth on the impurity diffusion source film 6a formed of $SiO_2$ or $SiO_3N_4$, the film can also serve as the selective growth mask. However, the film does not always function as the mask at the time of crystal growth. When the film is formed of ZrO or ZnO, the film does not function as the mask for the selective growth.

Therefore, according to a fourth embodiment of the present invention, a mask for the selective growth is additionally formed on the film, the function as the mask for the selective growth is surely implemented.

Figure 3:
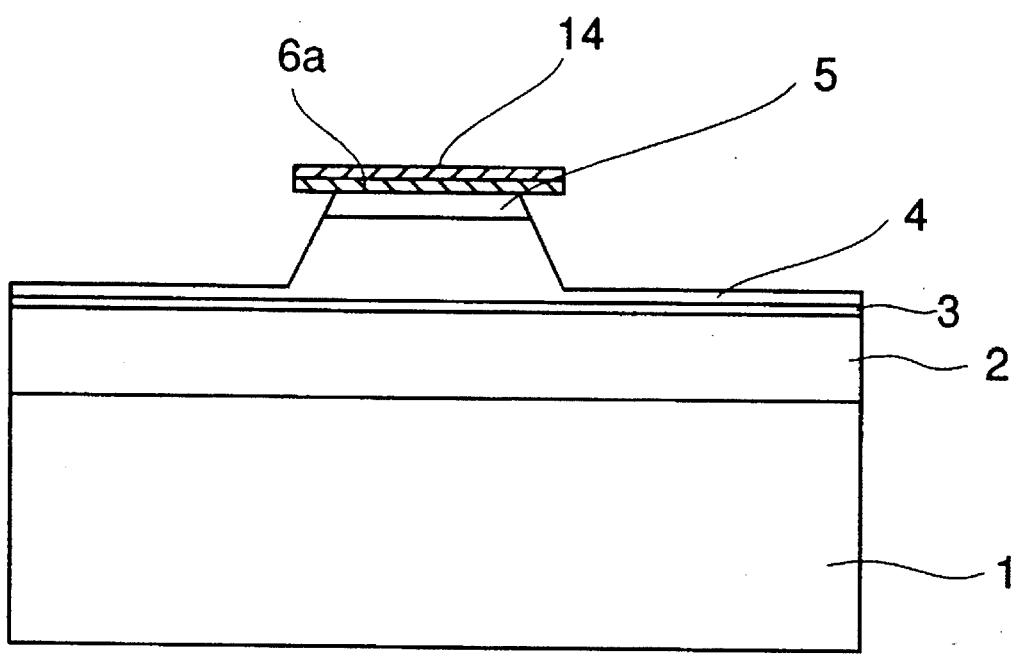
FIG. 3 is a view showing a part of process steps in a manufacturing method of a semiconductor laser according to a fourth embodiment of the present invention.

More specifically, according to the manufacturing method of a semiconductor laser of the fourth embodiment of the present invention, when the impurity diffusion source film 6 is formed in the step shown in FIG. 2(b), the film of $Si_3N_4$ or $SiO_2$ is formed on the impurity diffusion source film 6 by the CVD method. Thus, as shown in FIG. 3, a crystal growth mask 14 comprising $Si_3N_4$ or $SiO_2$ is formed on the impurity diffusion source film 6a for the ridge-etching. Therefore, when the current blocking layer 9 is buried and grown later, there is no crystal growth on the ridge 8. The selective growth mask film 14 is removed together with the impurity diffusion source film 6a by hydrofluoric acid or the like when the p-second GaAs contact layer 11 is formed on the whole surface after the current blocking layer 9 is grown.

As described above, according to the manufacturing method of the semiconductor laser of the fourth embodiment of the present invention, since the crystal growth mask 14 comprising $Si_3N_4$ or $SiO_2$ is formed on the impurity diffusion source film 6a, crystal growth on the ridge 8 is reliably prevented, whereby a semiconductor laser having a highly precise structure and a preferable characteristic is realized.

Embodiment 5

While the impurities are diffused from the impurity diffusion source film 6a into the first p type contact layer 5 and to the middle of the p type $(Al_{0.7}Ga_{0.3})_{0.5}In_{0.5}P$ upper cladding layer by heat generated during the crystal growth of the n-GaAs current blocking layer 9 in the above first embodiment of the present invention, according to a fifth embodiment of the present invention, the diffusion of the p type impurities from the impurity diffusion source film 6a to the upper cladding layer 4 is performed by heat generated at the time of crystal growth of the p type second contact layer 11 after the growth of the n-GaAs current blocking layer 9, in addition to the heat generated during the crystal growth of the n-GaAs current blocking layer 9. More specifically, although the crystal growth of the p type second contact layer 11 is performed at 500° C. for approximately one hour, the p type impurities are diffused into the upper cladding layer 4, that is, the diffused region 10 is formed by the temperature of 500° C. for approximately one hour, in addition to the temperature of 500° C. for growing the n-GaAs current blocking layer 9 for approximately 30 minutes.

According to the fifth embodiment of the present invention, there is surely provided the high-concentration layer 10 having a desired concentration in the p type $(Al_{0.7}Ga_{0.3})_{0.5}In_{0.5}P$ upper cladding layer 4 even when the diffusion of the p type impurities from the impurity diffusion source film 6a to the upper cladding layer is not sufficient during the crystal growth of the n-GaAs current blocking layer 9 in the above first embodiment of the present invention.

Embodiment 6

While the impurities are diffused from the impurity diffusion source film 6a into the first p type contact layer and to the middle of the p type $(Al_{0.7}Ga_{0.3})_{0.5}In_{0.5}P$ cladding layer 4 by heat during the crystal growth of the n-GaAs current blocking layer 9 and heat during the crystal growth of the p type second contact layer 11 according to the fifth embodiment of the present invention, according to a sixth embodiment of the present invention, the p type impurities are diffused from the impurity diffusion source film 6a to the lower layer by heat treatment (annealing) in an annealing furnace in addition to the heat generated during growth of the n-GaAs current blocking layer 9 and the p type second contact layer 11. For example, the annealing is performed at 600° C. for approximately 30 minutes, in addition to the heat treatment of the crystal growth. The method for the annealing is the same as that will be described in a twelfth embodiment referring to FIG. 9.

In addition, at this time, since diffusion of the p type impurities from the impurity diffusion source film 6a into the lower layer is performed by heat at the time of growth of the n-GaAs current blocking layer 9 and the p type second contact layer 11, after the crystal growth is all completed, a part of the wafer is cut and the degree of the diffusion is observed from a section thereof and annealing is further performed if there is an insufficient amount of diffusion, whereby the diffused region 10 of a required depth and concentration is provided.

Thus, according to the sixth embodiment of the present invention, the high-concentration layer 10 having a desired concentration is more surely provided in the p type $(Al_{0.7}Ga_{0.3})_{0.5}In_{0.5}P$ cladding layer 4, even when the diffusion of the p type impurities from the impurity diffusion source film 6a into the upper cladding layer 4 is insufficient from the heat generated during the crystal growth of the n-GaAs current blocking layer 9 and the p type second contact layer 11 in the fifth embodiment of the present invention.

Embodiment 7

While the active layer 3 comprises a single $In_{0.5}Ga_{0.5}P$ active layer in the first embodiment of the present invention, the active layer has a multi-quantum well structure according to a seventh embodiment of the present invention.

Figure 31:
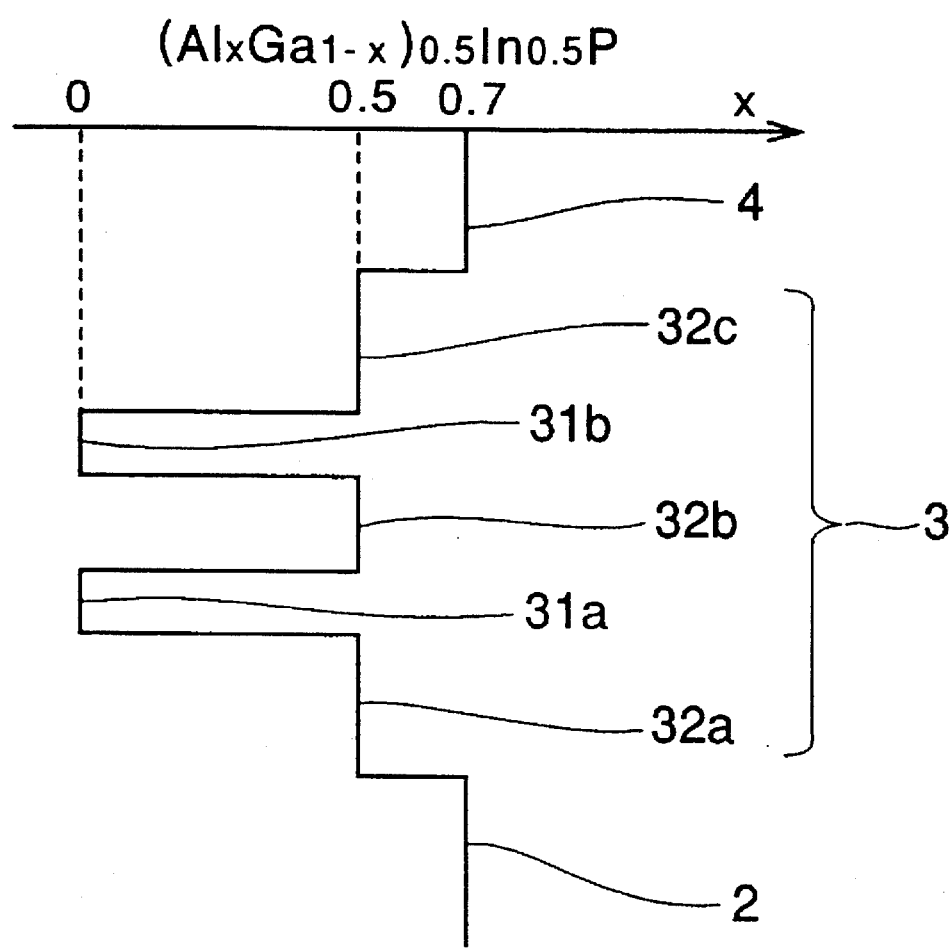
FIG. 31 is a view showing an active layer of a multi-quantum-well structure of a semiconductor laser manufactured by a manufacturing method of a semiconductor laser according to an embodiment of the present invention.

More specifically, according to the seventh embodiment of the present invention, an active layer 3 has a multi-quantum well structure shown in FIG. 31. In FIG. 31, quantum-well layers 31a and 31b are 5 nm in thickness and comprise $Ga_{0.5}In_{0.5}P$, and $(Al_xGa_{1-x})_{0.5}In_{0.5}P$ (x=0.5), and quantum-barrier layers 32a, 32b and 32c are disposed so as to sandwich the quantum-well layers 31a and 31b. In addition, the layers 32a and 32c are 8 nm in thickness and the layer 32b is 5 nm in thickness. Upper and lower cladding layers 2 and 4 described above comprise n type and p type $(Al_{0.7}Ga_{0.3})_{0.5}In_{0.5}P$, respectively.

The same effect as in the first to sixth embodiments of the present invention is also obtained in the seventh embodiment in which the active layer 3 comprises the multi-quantum well structure wherein the quantum-well layers 31a and 31b are sandwiched by the quantum-barrier layers 32b and 32c.

In addition, instead of the multi-quantum well structure in which two layers made of different materials are alternately laminated, the active layer 3 may comprise a natural superlattice structure comprising $Ga_{0.5}In_{0.5}P$ or the like.

Embodiment 8

While the above first to seventh embodiments of the present invention are provided so as to improve the characteristics of the 0.67 μm band semiconductor laser at the time of high-frequency superposition, according to an eighth embodiment of the present invention, the method of solid-phase diffusion using the impurity diffusion source film 6a is applied to a method of manufacturing a window structure which is extremely effective for high-output operation of a high-output AlGaInP visible light laser diode as described above.

Next, description will be given to a manufacturing method of a semiconductor laser according to the eighth embodiment of the present invention, in which the window structure is formed by the solid-phase diffusion with the impurity diffusion source film.

Figure 4:
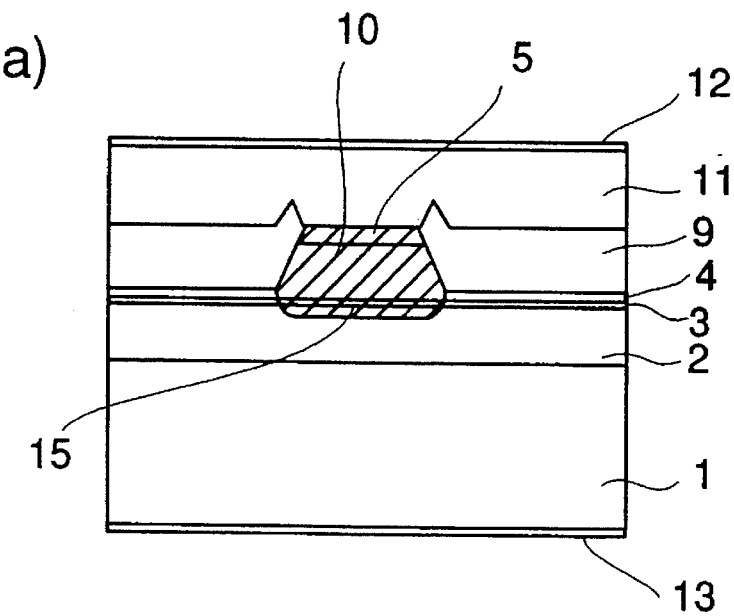
FIGS. 4(a)–4(c) are views showing a semiconductor laser having a window structure manufactured by a manufacturing method of a semiconductor laser according to an eighth embodiment of the present invention.
Figure 4:
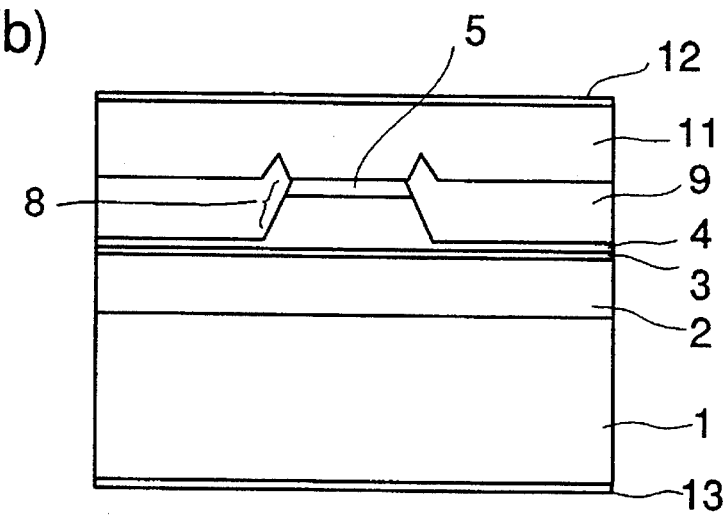
Figure 4:
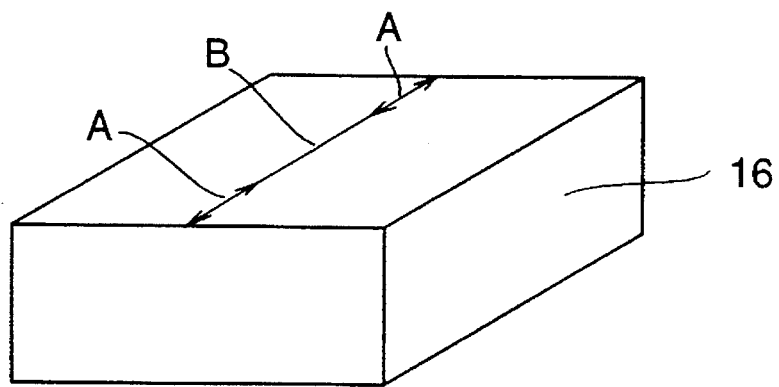

FIGS. 4(a)–4(c) show a semiconductor laser having the window structure manufactured by the manufacturing method according to the eighth embodiment of the present invention, and FIGS. 5(a) and 5(b) are views for describing the manufacturing method of the semiconductor laser of the eighth embodiment. FIG. 4(c) show a semiconductor laser chip 16, in which a reference character A designates a window region in the vicinity of a laser resonator facet and a reference character B designates a laser oscillation region other than the window region A. In addition, FIG. 4(a) is a sectional view of the region A and FIG. 4(b) is a sectional view of the region B. In FIG. 4(a), a disordered region 15 is formed by disordering the $In_{0.5}Ga_{0.5}P$ active layer 3 by impurity diffusion of Zn.

In addition, in FIGS. 5(a) and 5(b), reference numeral 17 designates a wafer comprising epitaxial layers formed by first crystal growth. Reference numeral 18c designates a part corresponding to a ridge region of a ridge-buried semiconductor laser having a ridge waveguide structure manufactured by the method of the present invention, and it is an impurity diffusion source layer formed at a part corresponding to the window structure of the region A in FIG. 4(c). Similar to the first embodiment of the present invention, the impurity diffusion source layer 18c is made of a material such as ZnO, CdO, MgO or the like, and Zn, Cd or Mg, respectively is diffused as an impurity into the lower semiconductor layer as a p type impurity.

First, the manufacturing method of the eighth embodiment of the present invention will be described.

First, by the first crystal growth, epitaxial layers, that is, an n-$(Al_{0.7}Ga_{0.3})In_{0.5}P$ cladding layer 2 having an impurity concentration of $1\times10^{17}$ cm$^{-3}$ and a thickness of 1.5 μm, an $In_{0.5}Ga_{0.5}P$ active layer 3 having a thickness of 0.07 μm, a p-$(Al_{0.7}Ga_{0.3})In_{0.5}P$ cladding layer 4 having an impurity concentration of $5\times10^{17}$ cm$^{-3}$ (the impurity is Zn or Si) and a thickness of 0.25 μm) and a p-GaAs first contact layer 5 having an impurity concentration of $2\times10^{19}$ cm$^{-3}$ and a thickness of 0.4 μm are grown on an n-GaAs semiconductor substrate having an impurity concentration of 1 to $3\times10^{18}$ cm$^{-3}$ and a thickness of 95 μm, whereby the wafer 17 shown in FIG. 5(a) is formed.

The active layer 3 has a multi-quantum well structure as shown in FIG. 31 like in the seventh embodiment of the present invention.

Then, the impurity diffusion source layer 18c comprising ZnO, CdO, MgO or the like is formed at two positions corresponding to the window structure and also corresponding to the upper portion of the ridge as shown in FIG. 5(a). When the above material is used, Zn, Cd or Mg, respectively, in the impurity diffusion source layer is diffused as the impurity into the lower semiconductor layer and becomes a p type impurity. The impurity diffusion source layer 18c is patterned by the method shown in FIGS. 6(a)–6(d).

More specifically, in FIGS. 6(a)–6(d), the impurity diffusion source film 18 comprising the above material is formed and then, the whole surface of the impurity diffusion source film 18 is patterned, using the stripe-shaped photoresist mask 19, along a region of the laser where the window structure is to be formed, thereby forming the stripe-shaped impurity diffusion source film 18a. For example, when a ZnO film is patterned, etching is performed using hydrofluoric acid.

Then, an $Si_3N_4$ or an $SiO_2$ film is formed on the whole surface and it is etched away using a photoresist mask (not shown) along the region in which the ridge is to be formed, leaving a part 14a of the SiN or the $SiO_2$ film along the ridge strip.

Using the stripe-shaped SiN or $SiO_2$ film 14a and the photoresist thereon as masks, an exposed part of the impurity diffusion source layer 18a is removed by dry etching using $CF_4$, for example, whereby the two impurity diffusion source films 18c and the SiN or $SiO_2$ film 14a covering each film 18c at a region where a ridge is to be formed is formed in the rectangular region shown in the figure.

After the two impurity diffusion source films 18c are formed, ridge etching is performed leaving the $Si_3N_4$ or $SiO_2$ film 14a thereon as the ridge etching mask and the selective growth mask, whereby the ridge 8 is formed.

Then, the n-GaAs current blocking layer 9 is grown and then, the ridge etching mask and the selective growth mask are removed. When the second GaAs contact layer 5 is grown, p type impurities are diffused from the impurity diffusion source layer 18b to the lower crystal growth layers 5 and 4 at the temperature of 500° C. or more during the growth of the current blocking layer for 30 minutes. When the p type impurities reach the $In_{0.5}Ga_{0.5}P$ active layer 3, the $In_{0.5}Ga_{0.5}P$ active layer 3 is disordered and the window structure layer 15 is formed.

As a result, the 0.67 μm band InGaP/InAlGaP system semiconductor laser having the window structure capable of high-output operation is provided as shown in FIG. 5(b).

According to the eighth embodiment of the present invention, in which the ridge-buried type 0.67 μm band InGaP/InAlGaP semiconductor laser having the ridge guidewave structure is manufactured, the impurity diffusion source film is formed under the ridge- etching mask at a part in which the window structure is to be formed, and the p type impurities are diffused from the impurity diffusion source film to the active layer through the p-contact layer 5 and the p-cladding layer 4 by the heat at the time of growth of the current blocking layer to disorder the active layer. Thus, the active layer of the quantum-well structure is disordered only in the vicinity of the facet of the laser resonator, whereby band gap energy is increased, and the window structure of the laser is formed. As a result, a 0.67 μm band InGaP/InAlGaP system semiconductor laser capable of high-output operation without generating facet destruction is realized. In addition, the above semiconductor laser is manufactured by a simple method with high precision.

In addition, although in the eighth embodiment the active layer has the multi-quantum well structure formed by the alternating lamination of two layers made of different materials, the active layer may comprise a natural superlattice structure of $Ga_{0.5}In_{0.5}P$ or the like, instead of the multi-quantum well structure.

Embodiment 9

While a component of the impurity diffusion source film 6 is diffused into the p-GaAs first contact layer and the $p-(Al_{0.7}Ga_{0.3})_{0.5}In_{0.5}P$ cladding layer 4 to become a p type dopant in each layer in a later process in the above eighth embodiment of the present invention, according to a ninth embodiment of the present invention, the impurity diffusion source film 6 comprises an impurity which becomes a p type dopant when diffused into the lower layers in the later process. For example, the film comprises $Al_2O_3$, $Si_2$, $SiO_3N_4$, SrO or the like doped with Zn, Cd or Mg, or $Al_2O_3$ doped with Si. The film is formed by a thermal CVD method.

According to the ninth embodiment of the present invention, the same effect as in the eighth embodiment is obtained.

Embodiment 10

While the impurity diffusion source film 6 comprises an impurity which becomes a p type dopant in each layer when diffused into the lower layers, that is, the film comprises $Al_2O_3$, $SiO_2$, $SiO_3N_4$, SrO or the like doped with Zn, Cd or Mg, or $Al_2O_3$ doped with Si in the above ninth embodiment of the present invention, according to a tenth embodiment of the present invention, when the impurity diffusion source film is used, the doping into the impurity diffusion source film is controlled, whereby the concentration of the impurities diffused into the lower layers is controlled.

More specifically, although the impurity concentration is not especially specified at the time of diffusion of the impurities from the impurity diffusion source film 6a in the above ninth embodiment, even when too many atoms of the impurities are diffused, if they cannot be activated, they do not act as charge carriers. Contrarily, crystallinity is degraded and when the inactive impurities are diffused to the active layer, an element characteristic is badly influenced and reliability of the element itself is also badly influenced. For example, when impurity atoms of $5\times10^{19}$ cm$^{-3}$ or more are diffused, if they cannot be activated, the reliability of the element itself is badly influenced.

Figure 5:
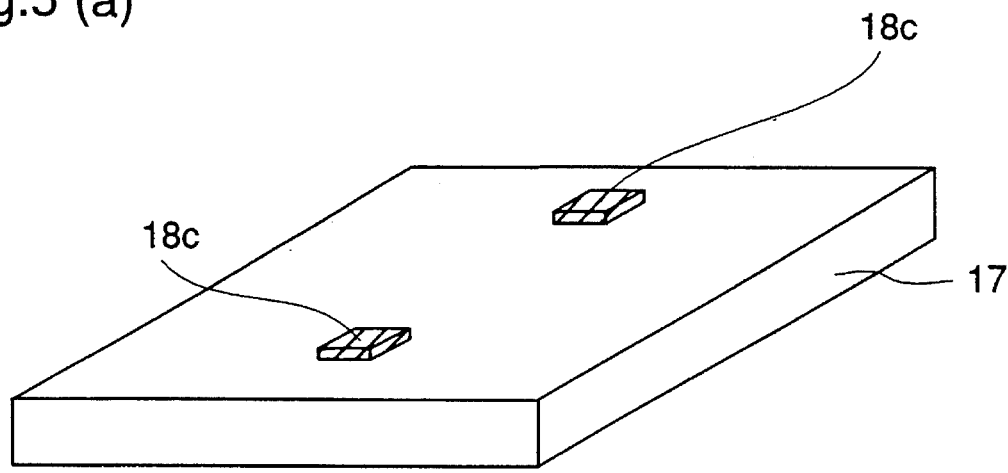
FIGS. 5(a) and 5(b) are views showing a part of process steps in the manufacturing method of the semiconductor laser having the window structure according to the eighth embodiment of the present invention.
Figure 5:
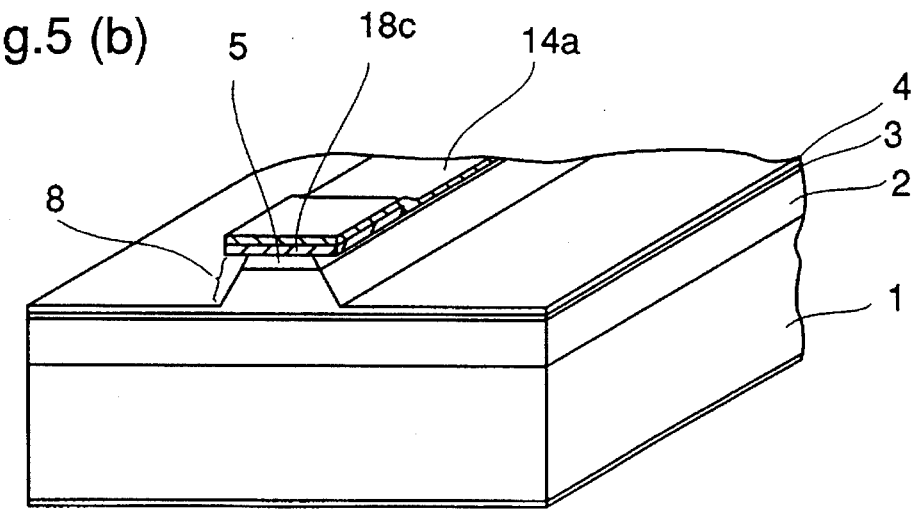

According to the tenth embodiment of the present invention, similar to the ninth embodiment, the impurities to be diffused are previously doped into the film which does not comprise the above impurity to be diffused to form the impurity diffusion source film 18a shown in FIG. 5. In addition, the doping amount in the film at this time is controlled. Thus, the dopant impurity concentration of the diffused region 10 formed by diffusion into the p-GaAs first contact layer 5 and the $p-(Al_{0.7}Ga_{0.3})_{0.5}In_{0.5}P$ cladding layer 4 is controlled. For example, when the impurity diffusion source film comprises $Al_2O_3$ doped with Zn, the concentration of the impurities diffused into the $p-(Al_{0.7}Ga_{0.3})_{0.5}In_{0.5}P$ cladding layer 4 is controlled. In this case, the amount quantity of impurities diffused into the crystal is proportional to the concentration of Zn doped in $Al_2O_3$. For example, it is 1 to $3\times10^{18}$ cm$^{-3}$ in a case of $Al_2O_3$ doped with 2 percent by weight of Zn. In this case, the doping method of impurities into the impurity diffusion source film is as follows, that is, when the impurity diffusion source film is formed by vapor phase growth, a gas including a dopant impurity is contained in a raw material gas containing a material constituting the film.

According to the manufacturing method of the semiconductor laser of the tenth embodiment of the present invention, the impurities to be diffused are previously doped in the film which does not comprise the impurity to be diffused, and the concentration of the region formed by diffusion is controlled by controlling the doping amount. Consequently, the concentration of the diffused impurities is controlled with high precision.

Embodiment 11

While the p type impurities are diffused from the impurity diffusion source film 6a and reach the active layer 3 through the p type contact layer 5 and the p type cladding layer 4 by heat generated during the crystal growth of the n-GaAs current blocking layer 9 to disorder the active layer in the above eighth embodiment of the present invention, according to an eleventh embodiment of the present invention, diffusion of the impurities from the impurity diffusion source film 6a to the lower layers is performed by heat generated at the time of crystal growth of the p type second contact layer 11 after the growth of the n-GaAs current blocking layer 9 in addition to the heat generated during the crystal growth of the n-GaAs current blocking layer 9. More specifically, since the crystal growth of the p type second contact layer 11 is performed at 500° C. for approximately one hour, the p type impurities are diffused into the upper cladding layer 4, that is, the diffused region 10 is formed by the temperature of 500° C. for approximately one hour, in addition to the temperature of 500° C. of the n-GaAs current blocking layer 9 for approximately 30 minutes.

Thus, according to the embodiment 11 of the present invention, even when the p type impurities cannot be diffused from the impurity diffusion source film 6a to the active layer 3 through the upper cladding layer 4 only by heat during the crystal growth of the n-GaAs current blocking layer 9 in the eighth embodiment of the present invention, since the diffusion is further performed by heat during growth of the p type contact layer 5, the impurities can reach the active layer, whereby the active layer is more surely disordered and the window structure is formed with high precision.

Embodiment 12

While the impurities are diffused from the impurity diffusion source film 6a into the first p type contact layer 5 and to the middle of the p type $(Al_{0.7}Ga_{0.3})_{0.5}In_{0.5}P$ cladding layer 4 by heat during the crystal growth of the p type second contact layer 11 in addition to heat during the crystal growth of the n-GaAs current blocking layer 9 according to the eighth and eleventh embodiments of the present invention, according to a twelfth embodiment of the present invention, the p type impurities are diffused from the impurity diffusion source film 6a to the lower layer by heat treatment (annealing) in an annealing furnace after all crystal growth is completed, in addition to the heat during growth of the n-GaAs current blocking layer 9 and the p type second contact layer 11. For example, the annealing is performed at 600° C. for approximately 30 minutes, in addition to the heat of the crystal growth.

Figure 8:
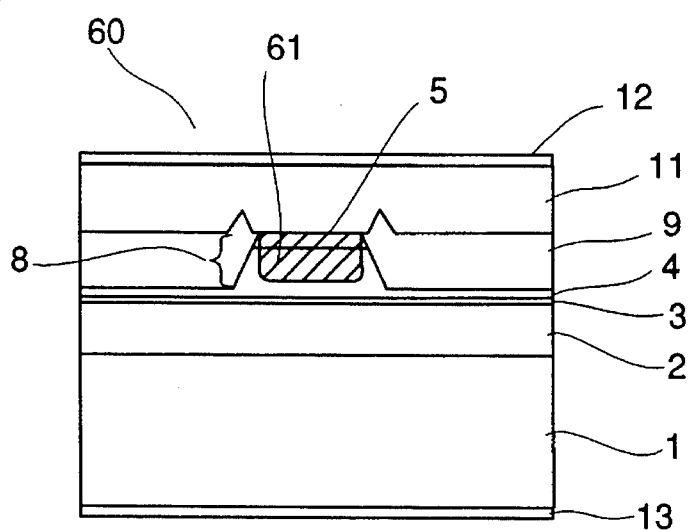
FIGS. 8(a)–8(c) are views showing states before and after the annealing according to a manufacturing method of a semiconductor laser according to a twelfth embodiment of the present invention and an annealing apparatus.
Figure 8:
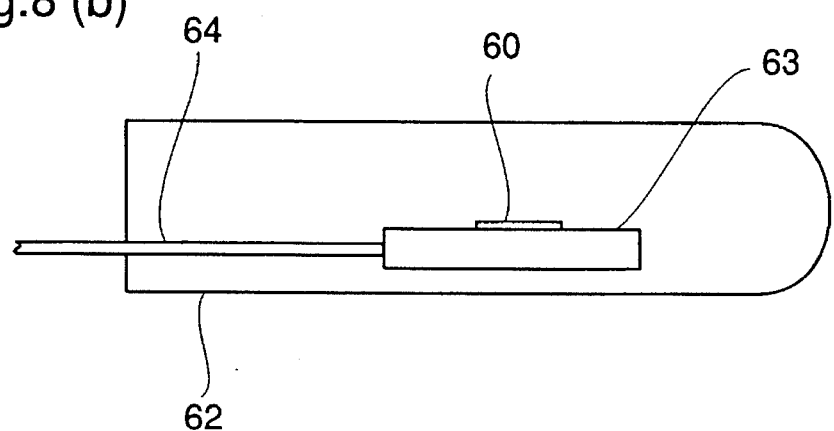
Figure 8:
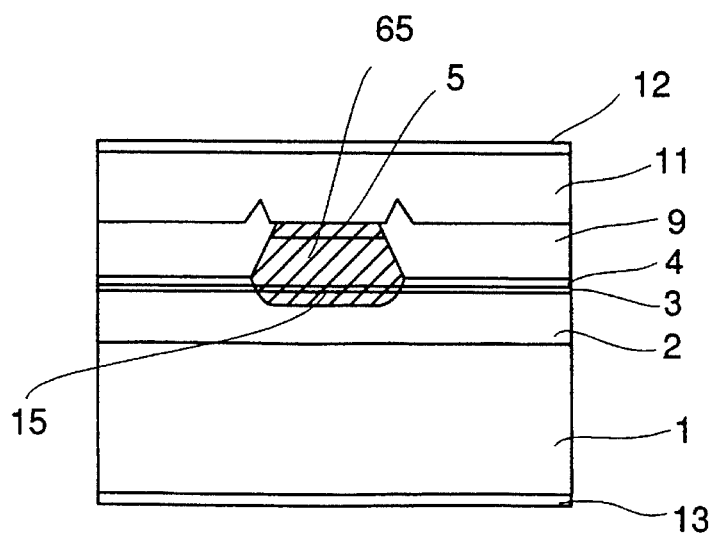

The twelfth embodiment of the present invention will be described referring to FIGS. 8(a)–8(c) in more detail. FIG. 8(a) shows a semiconductor laser before annealing according to the twelfth embodiment of the present invention. In FIG. 8(a), reference numeral 61 designates a diffused region formed by diffusing impurities into the middle of the p-$(Al_{0.7}Ga_{0.3})_{0.5}In_{0.5}P$ cladding layer 4 through the p-GaAs first contact layer 5 while the current blocking layer 9 is grown and the second contact layer 11 is grown, which do not reach the active layer 3 yet.

FIG. 8(b) shows an apparatus in which the semiconductor laser of FIG. 8(a) is annealed and drive-in diffusion is performed. The apparatus comprises an annealing apparatus body 62 made of a quartz tube, a boat 63 on which a wafer to be annealed is put, and a stick for pushing in and pulling the boat 63.

In addition, FIG. 8(c) shows the semiconductor laser after annealing. In the apparatus, the drive-in diffusion occurs in the diffused region 61 by annealing, whereby the region reaches the active layer 3 and a diffused region 65 is formed.

Although the impurities are diffused from the impurity diffusion source film 6a into the lower p-$(Al_{0.7}Ga_{0.3})_{0.5}In_{0.5}P$ cladding layer 4 and the p-GaAs first contact layer 5 by the heat at the time of buried-growth of the n type GaAs current blocking layer 9 and at the time of crystal growth of the p-GaAs second contact layer 11 and the diffused region 61 (corresponding to a part 10 in FIG. 2) is formed in the above twelfth embodiment of the present invention, the diffused region 61 does not reach the active layer 3 after all of the crystal growth. Then, the semiconductor laser is taken out of a crystal-growth furnace and put in the annealing apparatus body 62 using the stick 64 and the boat 63 and annealed for approximately 30 minutes, for example. Thus, the drive-in diffusion occurs from the diffused region 61 in the semiconductor laser, whereby the diffused region 65 reaching the active layer 3 is formed. Thus, the active layer 3 in the vicinity of the both ends of the resonator is disordered and the window region is formed.

In this case, a part of the wafer is cut to observe the degree of the diffusion from a section thereof after diffusion of the p type impurities from the impurity diffusion source film 6a into the lower layer is performed by heat at the time of growth of the n-GaAs current blocking layer 9 and the p type second contact layer 11, and annealing is further performed for an insufficient amount of diffusion, whereby the diffused region having a required depth and concentration is provided.

According to the manufacturing method of the semiconductor laser of the twelfth embodiment of the present invention, after the impurities are diffused into the middle of the p type upper cladding layer 4 by the heat during the crystal growth of the current blocking layer and the second contact layer, the semiconductor laser is annealed for drive-in diffusion, whereby the diffusion reaches the active layer 3. Consequently, the window region is formed by disordering the multi-quantum well active layer comprising $In_{0.5}Ga_{0.5}P$ with high yield.

Embodiment 13

While the impurity diffusion source layer 18c serving as a diffusion source at a position corresponding to the window structure is patterned by forming the striped impurity diffusion source film pattern 18a along the window region to be formed in the laser and then patterning it using the film serving as the striped selective growth mask along the ridge to be formed in the eighth embodiment of the present invention, according to a thirteenth embodiment of the present invention, the patterning is performed by another method.

More specifically, a patterning method of the impurity diffusion source film 18c in the semiconductor laser manufacturing method according to the thirteenth embodiment of the present invention will be described referring to FIGS. 7(a)–7(c).

Figure 6:
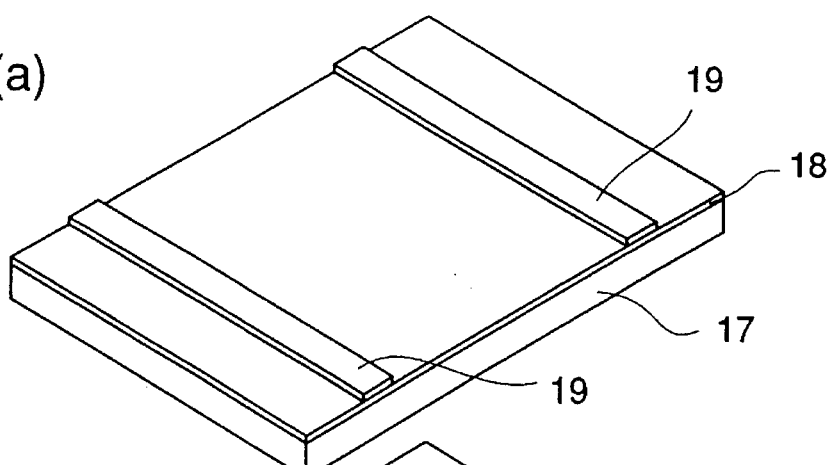
FIGS. 6(a)–6(d) are views showing a patterning process of an impurity diffusion source film in the manufacturing method of the semiconductor laser according to the eighth embodiment of the present invention.
Figure 6:
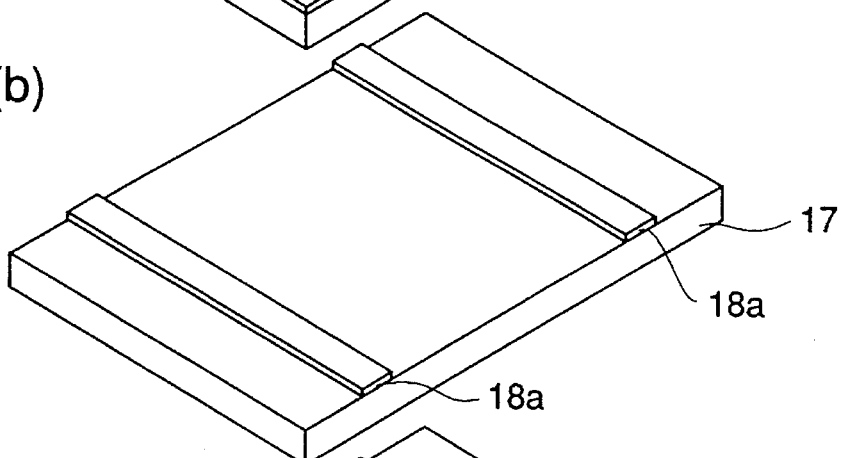
Figure 6:
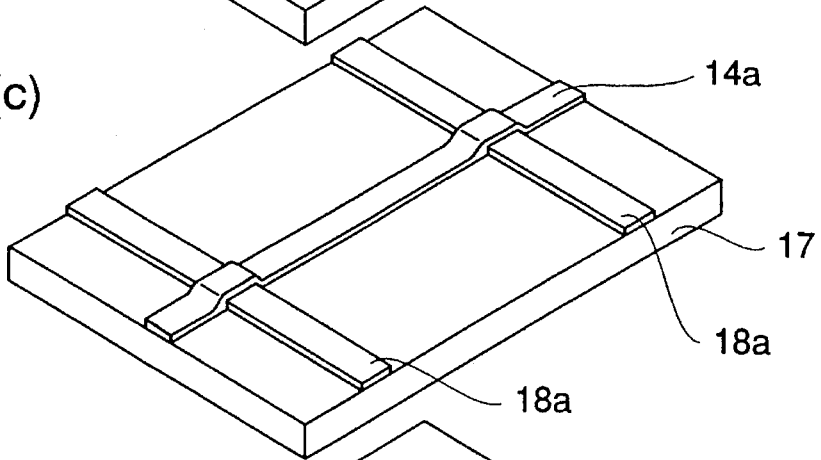
Figure 6:
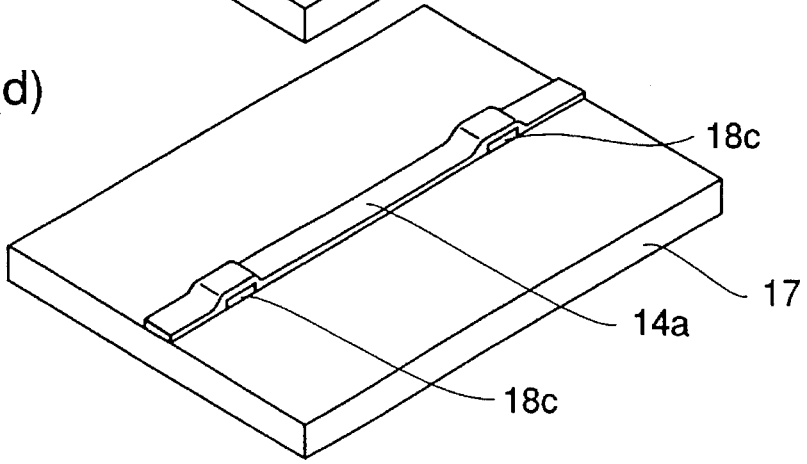

According to the sixteenth embodiment of the present invention, the impurity diffusion source film (designated by numeral 18 in FIG. 6(a)) comprising the above material is formed on the whole surface and then, patterned using a striped photoresist mask (not shown) along the window region to be formed in the laser, whereby the striped impurity diffusion source film 18a is formed, which is a state (which is the same as in FIG. 6(b)) shown in FIG. 7(a).

Then, the $Si_3N_4$ or $SiO_2$ film 14 is formed on the whole surface, and the striped impurity diffusion source film 18a and the $Si_3N_4$ or $SiO_2$ film 14 are simultaneously patterned by wet etching using the photoresist mask (not shown) along the ridge, whereby the two rectangular impurity diffusion source films 18c and the striped $Si_3N_4$ or $SiO_2$ film 14c along the ridge to be formed are formed as shown in FIG. 7(c).

Then, using a mask 14c comprising the $Si_3N_4$ or $SiO_2$ film as a ridge etching mask, the first GaAs contact layer 5 and a part of the p type upper cladding layer 4 are etched away to form the ridge 8. Then, the current blocking layer 9 is grown at each side of the ridge using the mask 14c as it is as a selective growth mask. Then, the impurity diffusion source film 18c and the selective growth mask 14c are removed, and the second contact layer 11 and other layers are formed as in the above-described embodiments, whereby a semiconductor laser which is the same as in the eighth embodiment of the present invention is completed.

However, it is preferable to apply the method when it is not difficult to simultaneously remove by etching a part of the striped impurity diffusion source film 18a other than the region 18c and a part of the $Si_3N_4$ film or the $SiO_2$ film 14 other than the region 18c.

Embodiment 14

According to the eighth to thirteenth embodiments of the present invention, the diffusion of the impurities from the impurity diffusion source film into the lower layers is performed over the whole width of the laser resonator, whereby the p type $(Al_{0.7}Ga_{0.3})_{0.5}In_{0.5}P$ cladding layer 4 having a high p type impurity concentration of 1 to $2\times10^{18}$ or more is formed. In addition, according to the eighth to thirteenth embodiments of the present invention, the diffusion of the impurities from the impurity diffusion source film to the lower layers is performed at the facet of the laser resonator where the window structure is to be formed so as to reach the active layer and disorder it, whereby the window structure is formed. Meanwhile, according to an embodiment 14 of the present invention, the p type upper cladding layer is formed so as to have a high concentration of impurities over the whole width of the laser resonator and also the window structure is formed by disordering the active layer at the facet of the laser resonator.

A manufacturing method of a semiconductor laser according to the fourteenth embodiment of the present invention will be described referring to FIG. 9.

Figure 9:
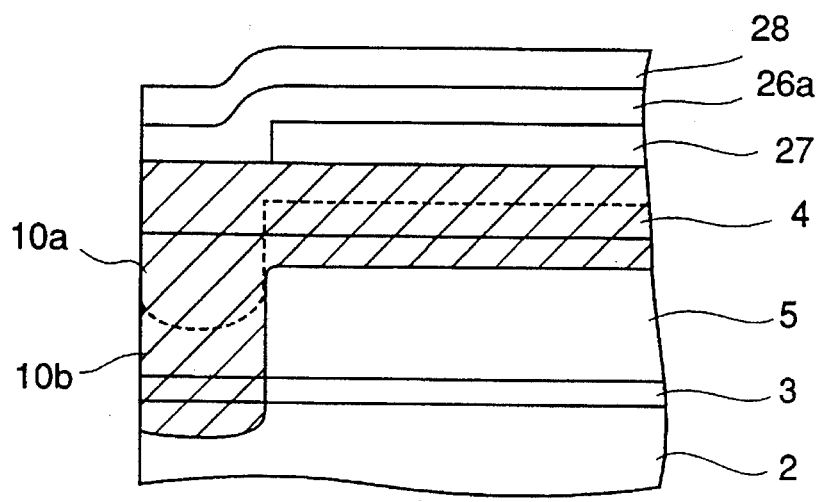
FIG. 9 is a view showing a part of process steps in a manufacturing method of a semiconductor laser according to a fourteenth embodiment of the present invention.

In FIG. 9, a diffusion-through film 26 comprising SiN is formed at a facet of the laser resonator of the p type GaAs first contact layer 5 other than a part where the window structure is to be formed. An impurity diffusion source film 27 comprising ZnO or the like is formed directly on the p type GaAs first contact layer 5 at the facet of the laser resonator and on the diffusion-through film 26 at a part other than the facet. A selective growth mask 28 is formed on the impurity diffusion source film 27. In addition, according to the fourteenth embodiment of the present invention, the structure of each layer of the semiconductor laser device is the same as in the eighth embodiment of the present invention.

Next, the manufacturing method of the semiconductor laser according to the fourteenth embodiment of the present invention will be described.

The method is the same as in the first embodiment of the present invention until the step of forming the p type GaAs first contact layer 5. Then, an SiN film which is not very dense and has a thickness of 500 or 1000 angstroms is formed on the whole surface of the p type GaAs first contact layer 5 by a PCVD (Plasma Chemical Vapor Deposition) method at 200° C., and is patterned so as to remove a region where the window structure is to be formed, whereby the diffusion-through film 26 comprising SiN is formed at a part other than the region where the window structure is to be formed.

Then, the impurity diffusion source film having a thickness of 1500 Å is formed on the whole surface by sputtering at 150° C. and the SiN or $Si_2O_3$ film serving as the selective growth mask is formed thereon. Then, they are patterned so as to be left over the whole width of the laser resonator on the ridge to be formed, whereby the diffusion-through film 26, the impurity diffusion source film 27, and the selective growth mask 28 are formed only at the region of the ridge to be formed. In addition, similar to the above embodiments, a component of the impurity diffusion source film becomes an impurity and for example, the film comprises ZnO, CdO, MgO, or the like. In this case, Zn, Cd or Mg, respectively, is diffused into the p-$(Al_{0.7}Ga_{0.3})_{0.5}In_{0.5}P$ cladding layer 4 and the p-GaAs first contact layer 5 as an impurity to become p type dopant.

Then, ridge-etching is performed using the film comprising the diffusion-through film 26, the impurity diffusion source film 27, and the selective growth mask 28 as a ridge-etching mask to remove a part of the p type first GaAs contact layer 5 and the p type cladding layer 4 other than the region of the ridge to be formed, whereby the ridge is formed. When the n type current blocking layer 9 is selectively grown, the p type impurities are diffused from the impurity diffusion source film 27 into the p type first GaAs contact layer 5 and the p type cladding layer 4 by heat generated while the n type current blocking layer 9 is grown.

Thus, the component in the impurity diffusion source film 27, such as Zn, is diffused as the impurity into the p type contact layer 5 and the p type cladding layer 4. At this time, according to the fourteenth embodiment of the present invention, since at a region other than the window structure to be formed the SiN film 26 which is not very dense is formed under the impurity diffusion source film 27 by the plasma CVD method as the diffusion-through film, the diffusion of impurities into the lower layer is less because it is prevented by the diffusion-through film 26 as compared with the region of the window structure to be formed which has no diffusion-through film 26. During the diffusion, a section profile is like the first impurity diffused region 10a shown in FIG. 9, and when the diffusion is further performed, it becomes like the second impurity diffused region 10b shown in FIG. 9. Consequently, the impurities reach the active layer 3 only at the region of the window structure to be formed, whereby the active layer 3 is disordered. When the p type impurity from the impurity diffusion source film 27 reaches the AlGaInP cladding layer 4 through the GaAs contact layer 5, it produces a charge carrier, so that the degree of diffusion of the impurities in the p type cladding layer 4 at the region other than the region of the window structure to be formed is controlled by the thickness of the SiN through film 26 formed by the plasma CVD method.

Then, similar to the first to fifth embodiments of the present invention, the p type second GaAs contact layer 11 and the electrodes 12 and 13 are formed. Then, the semiconductor laser of the twelfth embodiment of the present invention is completed.

Thus, at the region where the window structure is to be formed in the vicinity of the facet of the laser resonator, the diffused region 10b reaches the active layer 3 to disorder the active layer 3, whereby the window structure is formed. At a part other than that region, the impurity diffused region 10 is formed in the p type contact layer and the p type cladding layer 4, whereby the diffused region 10 having a high concentration of impurities is formed in the p type cladding layer 4.

According to the manufacturing method of the semiconductor laser of the fourteenth embodiment of the present invention, there is provided a semiconductor laser which has the following characteristics, that is, the p type $(Al_{0.7}Ga_{0.3})_{0.5}In_{0.5}P$ cladding layer having high p type impurity concentration is formed by devising the manufacturing method of the impurity diffusion source film according to the first to seventh embodiments of the present invention, and the window structure is formed by disordering the active layer at the facet of the laser resonator according to the eighth to thirteenth embodiments of the present invention, so that the element resistance of the laser is significantly reduced and the characteristic at the time of high-frequency superposition is significantly improved because the impurity concentration in the p type cladding layer is increased, and high-output operation is possible without degrading the facet because the window structure is formed.

Embodiment 15

In the above-described fourteenth embodiment, the diffusion-through film 26 is formed on the region of the ridge to be formed other than the region of the window structure to be formed, the impurity diffusion source film 27 is formed over the whole width of the laser resonator on the region of the ridge to be formed and the selective growth mask 28 is formed thereon, in order to form the p type upper cladding layer having a high impurity concentration over the whole width of the laser resonator and form the window structure by disordering the active layer at the facet of the laser resonator. However, according to a fifteenth embodiment of the present invention, the impurity diffusion source film comprises a second impurity diffusion source film having a thick film thickness, that is, having a large quantity of impurities, at the region of the window to be formed and a first impurity diffusion source film having a thin film thickness, that is, having a small amount quantity of impurities over the region of the ridge to be formed.

Next, a manufacturing method of a semiconductor laser according to the fifteenth embodiment of the present invention will be described referring to FIG. 10.

Figure 10:
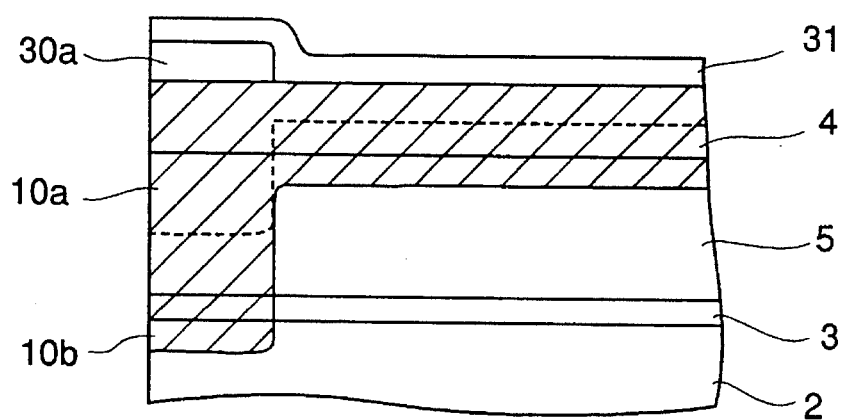
FIG. 10 is a view showing a part of process steps in a manufacturing method of a semiconductor laser according to a fifteenth embodiment of the present invention.
Figure 11:
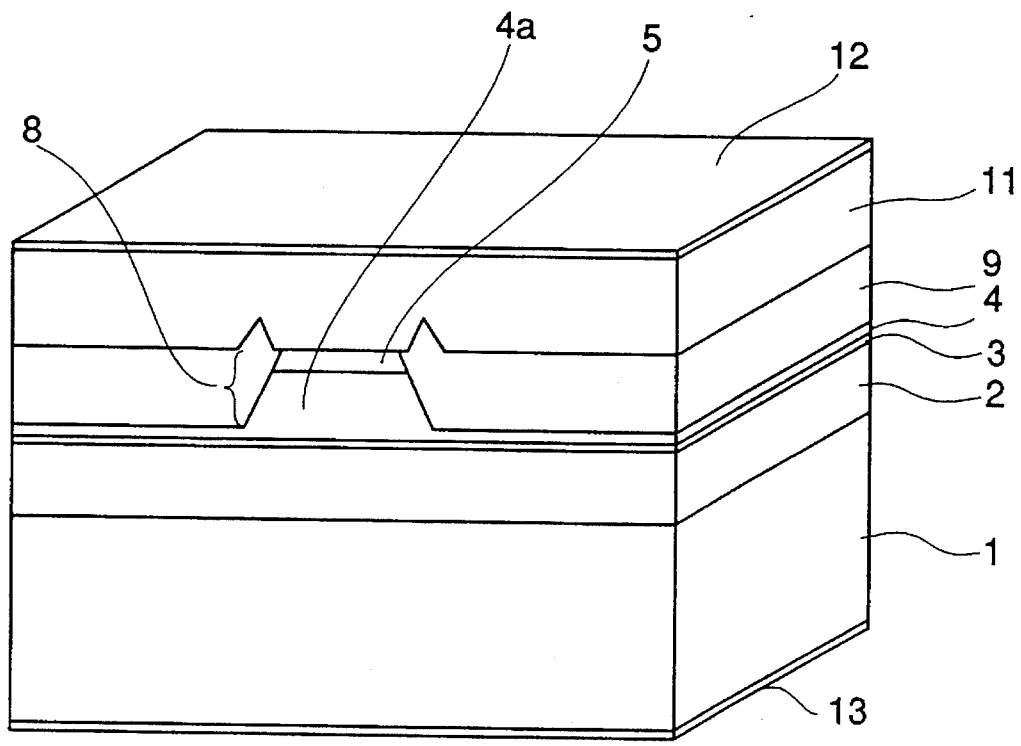
FIG. 11 is a view showing a structure of a conventional 0.67 μm band semiconductor laser.

In FIG. 10, reference numeral 30a designates a second impurity diffusion source film having a thickness of 1000 Å and formed directly on the p type GaAs first contact layer 5 at the facet of the laser resonator where the window structure is formed. Reference numeral 31 designates a first impurity diffusion source film having a thickness of 500 Å and including a facet part of the laser resonator where the window structure is to be formed. The first impurity diffusion source film 31 is formed over the region of the laser where the ridge is to be formed.

Next, the manufacturing method of the semiconductor laser according to the fifteenth embodiment of the present invention will be described.

First, similar to the first embodiment of the present invention, the n-$(Al_{0.7}Ga_{0.3})In_{0.5}P$ cladding layer 2, the $In_{0.5}Ga_{0.5}P$ active layer 3, the p-$(Al_{0.7}Ga_{0.3})In_{0.5}P$ cladding layer 4, and the p-GaAs first contact layer 5 are formed by first crystal growth on the n-GaAs semiconductor substrate, whereby the wafer 17 shown in FIG. 5(a) is formed.

Then, the second impurity diffusion source layer is formed at two regions where the window structure is to be formed on the region of the ridge to be formed, and the first impurity diffusion source film 31 is formed over the region of the ridge to be formed. The patterning of the impurity diffusion source film is performed by almost the same method as in FIG. 7 in a case where the first and second impurity diffusion source films are made of the same material.

More specifically, first, similar to that shown in FIG. 7(a), the second impurity diffusion source film comprising the above material is formed on the whole surface and then, the stripe-shaped second impurity diffusion source film 30a (corresponding to a part 18a) is formed by patterning the impurity diffusion source film 30 formed on the whole surface using the striped photoresist mask along the region of the window to be formed in the laser. For example, when a ZnO film is patterned, etching is performed using hydrofluoric acid.

Then, instead of the $Si_3N_4$ or $SiO_2$ film 14 shown in FIG. 7, the first impurity diffusion source film 31 (corresponding to a part 14), or the film 31 and a mask comprising $SiO_2$ or SiN for later selective growth are formed on the whole surface and then, the first and second impurity diffusion source films 31 (14) and 30a (18a) are etched away using a photoresist mask (not shown) along the region of the ridge so as to leave the first impurity diffusion source film 31 (corresponding to a part 14c) and the second impurity diffusion source film 30a (corresponding to a part 18c) along the striped ridge.

After the first and second impurity diffusion source films 31 and 30a are thus formed, ridge etching is performed using the first impurity diffusion source film 31 or the film 31 and the $Si_3N_4$ or $SiO_2$ film (not shown) formed thereon as the ridge etching mask or the selective growth mask to form the ridge 8. Alternatively, after the first and second impurity diffusion source films 31 and 30a are formed, the mask used when the films 31 and 30a are formed may be removed and the ridge etching mask and the selective growth mask may be newly formed.

Then, the n-GaAs current blocking layer 9 is grown, and the ridge etching mask and selective growth mask are removed. When the second GaAs contact layer 5 is grown, the component or the impurity, such as Zn, in the impurity diffusion source film 30a or the films 30a and 31 are diffused into the lower p type contact layer 5 and the p type cladding layer 4. At this time, according to the fifteenth embodiment of the present invention, the impurity diffusion source films 30a and 31 are thick, that is, 1500 Å, at the region where the window structure is to be formed while the impurity diffusion source film 31 is thin, that is, 500 Å, at other than the window region. Therefore, the diffusion of impurities into the lower layer is large at the window region but small at other than the window region. As a result, similar to in FIG. 9, the diffusion profile is like the impurity diffused region 10a or the impurity diffused region 10b as shown in FIG. 10. Thus, the diffused region reaches the active layer 3 to disorder the layer 3 and the window structure is formed in the vicinity of the facet of the laser resonator, and the impurity diffused region 10 is formed in the p type contact layer 5 and the p type cladding layer 4 at the region other than the window region, whereby the region having a high concentration of p type impurities is formed in the p type cladding layer 4.

According to the fifteenth embodiment of the present invention, since the impurity diffusion source film comprising the thick second impurity diffusion source film 30a is formed at two positions corresponding to the window and to the ridge portion, and the thin first impurity diffusion source film 31 over the ridge striped region, the impurities from the thick impurity diffusion source layers 30a and 31 are deeply diffused into the active layer 3 to disorder the layer while the impurities from the thin impurity diffusion source layer 31 are shallowly diffused to form the diffused region 10 of high concentration in the upper cladding layer 4. Thus, similar to the fourteenth embodiment of the present invention, there is provided a semiconductor laser having the following two characteristics. That is, since the impurity concentration of the p type cladding layer is high, the element resistance of the laser is significantly reduced and the characteristic at the time of high-frequency superposition is significantly improved. Further, since the window structure is provided, the high-output operation is performed without causing degradation of the end face.

Embodiment 16

Figure 7:
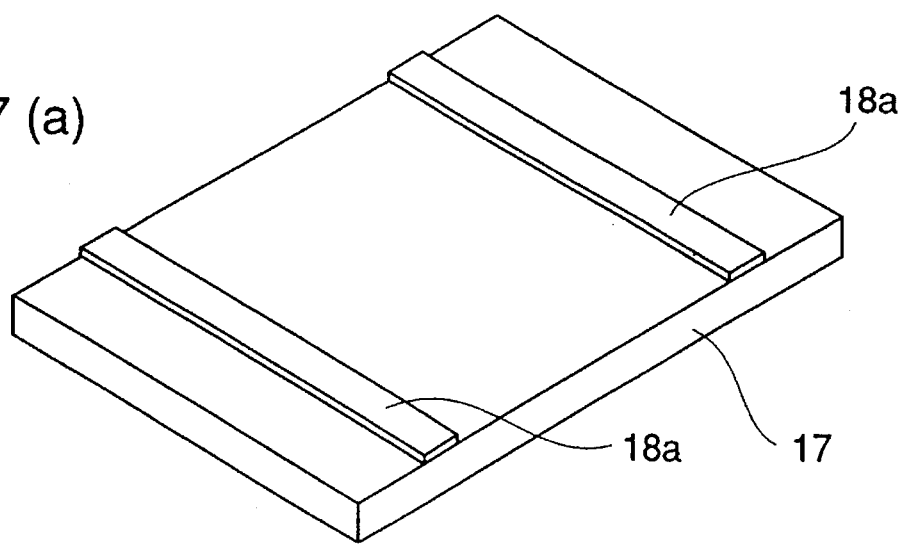
FIGS. 7(a)–7(c) are views showing a patterning process of an impurity diffusion source film in a manufacturing method of a semiconductor laser according to a thirteenth embodiment of the present invention.
Figure 7:
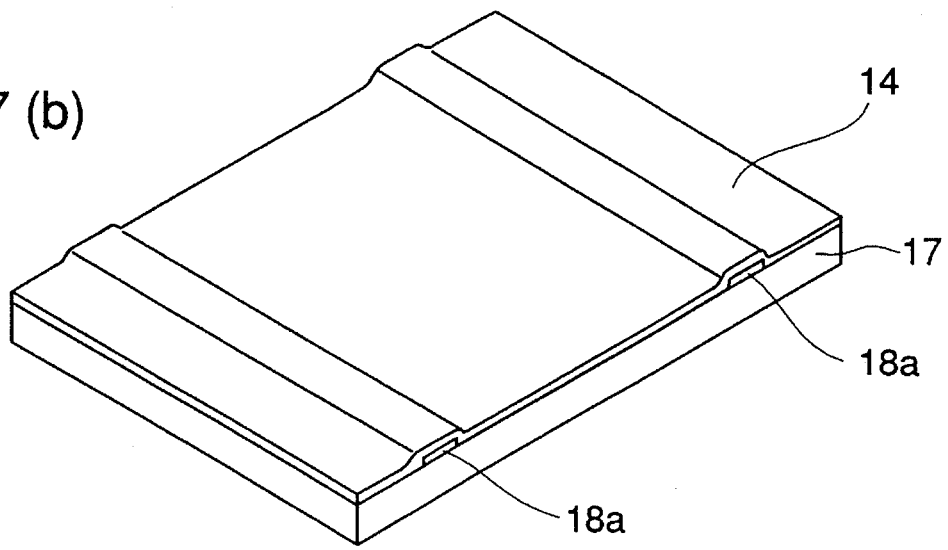
Figure 7:
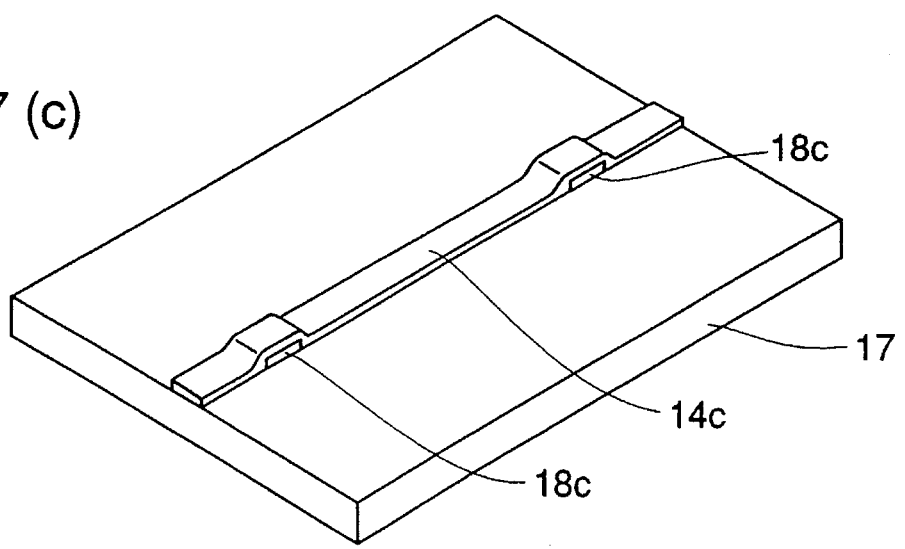

While the patterning of the impurity diffusion source layer is performed by almost the same method as in FIG. 7 in the fifteenth embodiment of the present invention, according to the sixteenth embodiment of the present invention, when the first and second impurity diffusion source films are made of the different materials, the patterning is performed by almost the same method as in FIGS. 6(a)–6(d).

A method according to the sixteenth embodiment of the present invention will be described hereinafter.

More specifically, after the impurity diffusion source film 18 made of the above material is formed on the whole surface, the impurity diffusion source film 18 is patterned using the stripe-shaped photoresist mask 19 along the region where the window is to be formed in the laser, forming the stripe-shaped second impurity diffusion source film 18a. For example, the film comprises ZnO as its component element.

Thereafter, a film comprising the material of the first impurity diffusion source film is formed on the whole surface and etched using a photoresist mask (not shown) along the region where the ridge is to be formed so as not to etch the second impurity diffusion source film 18a, whereby only a part (corresponding to the part 14a) of the film comprising the material of the first impurity diffusion source film is left along the stripe-shaped ridge without etching the striped second impurity diffusion source film 18a. In this case, a film which will be the selective growth mask later may be simultaneously formed on the first impurity diffusion source film (14a) and patterned with the first impurity diffusion source film.

Then, the exposed part of the impurity diffusion source layer 18a is removed using the first impurity diffusion source film and the $Si_3N_4$ or $SiO_2$ film 14a formed thereon as a mask. For example, when the impurity diffusion source layer 18a comprises ZnO, it is removed by dry etching using $CF_4$, for example. Consequently, two rectangular second impurity diffusion source films 18c are formed, and the stripe-shaped first impurity diffusion source film 14a is formed along the region of the ridge to be formed thereon.

The first and second impurity diffusion source films may be made of different materials. For example, when the second impurity diffusion source film comprises ZnO, the first impurity diffusion source film comprises CdO or MgO, or a film comprising Cd or Mg as a dopant.

Thus, according to the sixteenth embodiment of the present invention, the impurity diffusion source film having the same structure as in the fifteenth embodiment is formed, whereby there is provided a semiconductor laser having the following two characteristics. That is, the impurity concentration of the p type cladding layer is high, so that the element resistance of the laser is significantly reduced and the characteristic at the time of high-frequency superposition is significantly improved. Further, since the window structure is provided, the high-power operation is performed without causing degradation of the facet.

Embodiment 17

In the above fourteenth to sixteenth embodiments of the present invention, the component of the impurity diffusion source film 26a or the first and second impurity diffusion source films 30a and 31 is diffused as the impurity into the p-GaAs first contact layer 5 and the p-$(Al_{0.7}Ga_{0.3})_{0.5}In_{0.5}P$ cladding layer 4 in the later process to become a p type dopant in each layer.

According to a seventeenth embodiment of the present invention, the impurity diffusion source film comprises an impurity which becomes a p type dopant in each layer when diffused into the lower layers in the later process. For example, the film comprises $Al_2O_3$, $SiO_2$, $Si_3N_4$, SrO or the like doped with Zn, Cd or Mg, or $Al_2O_3$ doped with Si, which is formed by the thermal CVD method.

According to the seventeenth embodiment of the present invention, the same effect as in the above fourteenth and fifteenth embodiments is provided.

Embodiment 18

While the impurity diffusion source film 26a or the first and second impurity diffusion source films 30a and 31 comprise an impurity which becomes the p type dopant in each layer when diffused into the lower layers in the later process, more specifically, the film comprises $Al_2O_3$, $SiO_2$, $Si_3N_4$, SrO or the like doped with Zn, Cd or Mg, or $Al_2O_3$ doped with Si, according to an eighteenth embodiment of the present invention, when the above impurity diffusion source film is used, the concentration of the impurities diffused into the lower layers is controlled by controlling the dopant quantity in the impurity diffusion source film.

More specifically, although the impurity concentration is not especially specified at the time of diffusion of the impurities from the impurity diffusion source film in the above seventeenth embodiment, even when too many atoms of the impurities are diffused, if they cannot be activated, they do not act as charge carriers. Contrarily, crystallinity is degraded and when the inactivated impurities are diffused into the active layer, an element characteristic is badly influenced and reliability of the element itself is also badly influenced. For example, when the impurity atom concentration is $5 \times 10^{19}$ $cm^{-3}$ or more, if the atoms cannot be activated, the reliability of the element itself is badly influenced.

Then, according to the eighteenth embodiment of the present invention, the impurities to be diffused are previously doped in a film which does not comprise the above impurity to be diffused, and this film is used as the impurity diffusion source film 26a shown in FIG. 9 or the impurity diffusion source films 30a and 31 shown in FIG. 10. In addition, the doping amount in this film is controlled. Thus, the concentration of impurities diffused into the p-$(Al_{0.7}Ga_{0.3})_{0.5}In_{0.5}P$ cladding layer 4 and the p-GaAs first contact layer 5 is controlled. For example, when the impurity diffusion source film is formed of $Al_2O_3$ doped with Zn, the concentration of the impurities diffused into the p-$(Al_{0.7}Ga_{0.3})_{0.5}In_{0.5}P$ cladding layer 4 is controlled. In this case, the quantity of impurities diffused into the crystal is proportional to the concentration of Zn in $Al_2O_3$. For example, it is 1 to $3 \times 10^{18}$ $cm^{-3}$ in a case of $Al_2O_3$ doped with 2 percent by weigh of Zn. In this case, according to a method of incorporating impurities into the impurity diffusion source film, when the impurity diffusion source film is formed by vapor phase growth, a gas including dopant impurities is contained in a raw material gas including a material constituting the film in a desired amount.

According to the manufacturing method of the eighteenth embodiment of the present invention, the impurity to be diffused is previously doped in a film which does not comprise the impurity to be diffused, and the concentration of the region formed by diffusion is controlled by controlling the doping amount. Consequently, the concentration of the diffused impurities is controlled with high precision.

Embodiment 19

In a case where the impurity diffusion source film according to the fourteenth to eighteenth embodiments of the present invention is formed of $SiO_2$ or $Si_3N_4$ doped with impurities, when the current blocking layer 9 is regrown, the source film serves as the mask for the crystal growth. More specifically, since the crystal growth is not performed on the impurity diffusion source film comprising $SiO_2$ or $Si_3N_4$, the mask serves also as a selective growth mask. However, the film does not always serve as the mask for the crystal growth. For example, a film comprising ZrO or ZnO does not serve as the mask for the selective growth.

Therefore, according to the nineteenth embodiment of the present invention, since the mask for the selective growth is additionally formed on the impurity diffusion source film, it surely serves as the mask for the selective growth.

More specifically, according to the manufacturing method of the semiconductor laser of the nineteenth embodiment of the present invention, as shown in FIG. 3, the crystal growth mask 14 comprising $Si_3N_4$ or $SiO_2$ is formed on the impurity diffusion source film 6a by the thermal CVD method. Thus, when the current blocking layer 9 is grown later, there is no crystal growth on the ridge 8. The selective growth mask film 14 is removed together with the impurity diffusion source film 6a by hydrofluoric acid or the like when the p-second GaAs contact layer 11 is formed after the current blocking layer 9 is grown.

As described above, according to the manufacturing method of the semiconductor laser of the nineteenth embodiment of the present invention, since the crystal growth mask 14 comprising $Si_3N_4$ or $SiO_2$ is formed on the impurity diffusion source film 6a, the crystal growth is not surely performed on the ridge 8, whereby a semiconductor laser having highly precise structure and preferable characteristic is realized.

Embodiment 20

While the impurities are diffused from the impurity diffusion source film 6a into the first p type contact layer 5 and to the middle of the p type $(Al_{0.7}Ga_{0.3})_{0.5}In_{0.5}P$ upper cladding layer 4 by heat generated during the crystal growth of the n-GaAs current blocking layer 9 in the above fourteenth embodiment of the present invention, according to a twentieth embodiment of the present invention, diffusion of the p type impurities from the impurity diffusion source film 6a into the upper cladding layer 4 is performed by heat generated at the time of crystal growth of the p type second contact layer 11 after the growth of the n-GaAs current blocking layer 9 in addition to the heat generated during the crystal growth of the n-GaAs current blocking layer 9. In addition, at the time of the crystal growth of the p type second contact layer 11, the temperature is 500° C. for approximately one hour.

Thus, according to the twentieth embodiment of the present invention, there is surely provided the high-concentration layer having a desired concentration in the p type $(Al_{0.7}Ga_{0.3})_{0.5}In_{0.5}P$ upper cladding layer 4 even when the diffusion of the p type impurities from the impurity diffusion source film 6a to the upper cladding layer is not sufficient only by the heat during the crystal growth of the n-GaAs current blocking layer 9 in the first embodiment.

Embodiment 21

While the impurities are diffused from the impurity diffusion source film into the first p type contact layer 5 and to the middle of the p type $(Al_{0.7}Ga_{0.3})_{0.5}In_{0.5}P$ cladding layer 4 by heat during the crystal growth of the n-GaAs current blocking layer 9 and by heat during the crystal growth of the p type second contact layer 11 according to the twentieth embodiment of the present invention, according to a twenty-first embodiment of the present invention, the p type impurities are diffused from the impurity diffusion source film 6a into the lower layer by heat treatment (annealing) in an annealing furnace after all crystal growth is completed and by the heat generated during growth of the n-GaAs current blocking layer 9 and the p type second contact layer 11. For example, the annealing is performed at 600° C. for approximately 30 minutes.

In addition, at this time, since diffusion of the p type impurities from the impurity diffusion source film into the lower layer is performed by heat at the time of growth of the n-GaAs current blocking layer 9 and the p type second contact layer 11 after the crystal growth is all completed, a part of the wafer is cut and the degree of the diffusion is observed from a section thereof and annealing is further performed for any insufficient amount of diffusion, whereby the diffused region 10 of a required depth and concentration is provided.

Thus, according to the twenty-first embodiment of the present invention, the high-concentration layer having a desired concentration is more surely provided in the p type $(Al_{0.7}Ga_{0.3})_{0.5}In_{0.5}P$ cladding layer 4, even when the diffusion of the p type impurities from the impurity diffusion source film into the upper cladding layer 4 is sometimes insufficient only by the heat generated during the crystal growth of the n-GaAs current blocking layer 9 and the p type second contact layer 11 in the fourteenth and nineteenth embodiments of the present invention.

What is claimed is:

1. A method of manufacturing a buried ridge semiconductor laser comprising:

growing semiconductor layers comprising at least a first conductivity type lower cladding layer, an active layer, and a second conductivity type upper cladding layer on a semiconductor substrate;

forming a stripe-shaped impurity diffusion source film comprising atoms producing the second conductivity type when diffused into the upper cladding layer on the upper cladding layer;

ridge-etching the semiconductor layers using the stripe-shaped impurity diffusion source film as an etching mask so that the second conductivity type upper cladding layer has a stripe-shaped ridge;

growing a first conductivity type current blocking layer on both sides of the ridge, burying the ridge; and forming a high dopant impurity concentration region comprising a dopant producing the second conductivity type in the second conductivity type upper cladding layer of the ridge by diffusing the atoms producing the second conductivity type from the stripe-shaped impurity diffusion source film into the upper cladding layer throughout the ridge in a heat treatment.

2. The method of manufacturing a semiconductor laser according to claim 1 wherein the impurity diffusion source film comprises a material containing atoms producing the second conductivity type when diffused into the second conductivity type upper cladding layer.

3. The method of manufacturing a semiconductor laser according to claim 1 wherein the impurity diffusion source film is selected from the group consisting of ZnO, CdO, and MgO.

4. The method of manufacturing a semiconductor laser according to claim 1 wherein the impurity diffusion source film comprises a dopant impurity producing the second conductivity type when diffused into the second conductivity type upper cladding layer.

5. The method of manufacturing a semiconductor laser according to claim 4 including controlling the concentration of impurities diffused into the upper cladding layer by controlling the quantity of impurities in the impurity diffusion source film.

6. The method of manufacturing a semiconductor laser according to claim 5 wherein the impurity diffusion source film is selected from the group consisting of $Al_2O_3$, $SiO_2$, $Si_3N_4$, and SrO doped with one of Zn, Cd, and Mg, and $Al_2O_3$ doped with Si.

7. The method of manufacturing a semiconductor laser according to claim 1 including growing a second conductivity type first contact layer on the second conductivity type upper cladding layer.

8. The method of manufacturing a semiconductor laser according to claim 1 wherein the impurity diffusion source film serves as the sole ridge-etching mask.

9. The method of manufacturing a semiconductor laser according to claim 1 including forming a film serving as a selective growth mask in the growth of the current blocking layer on the impurity diffusion source film and removing the film serving as the selective growth mask and the impurity diffusion source film after the ridge-etching.

10. The method of manufacturing a semiconductor laser according to claim 1 including diffusing the dopant impurities during growth of the first conductivity type current blocking layer.

11. The method of manufacturing a semiconductor laser according to claim 1 comprising growing a second conductivity type second contact layer on the ridge and the first conductivity type current blocking layer on each side of the ridge after the growth of the first conductivity type current blocking layer.

12. The method of manufacturing a semiconductor laser according to claim 11 including diffusing dopant impurities during the growth of the first conductivity type current blocking layer and of the second contact layer.

13. The method of manufacturing a semiconductor laser according to claim 11 including diffusing dopant impurities during the growth of the first conductivity type current blocking layer and of the second contact layer and by annealing after all crystal growth is completed.

14. The method of manufacturing a semiconductor laser according to claim 13 including observing the degree of diffusion of impurities from the impurity diffusion source film into the upper cladding layer from a section of a wafer after all crystal growth is completed; and annealing to correct any insufficient amount of diffusion.

15. The method of manufacturing a semiconductor laser according to claim 8 wherein the semiconductor substrate is n type GaAs, the first conductivity type lower cladding layer is n-type $(Al_{0.7}Ga_{0.3})_{0.5}In_{0.5}P$, active layer is $In_{0.5}Ga_{0.5}P$, and the second conductivity type upper cladding layer is p-type $(Al_{0.7}Ga_{0.3})_{0.5}In_{0.5}P$, and including a p-type GaAs first contact layer and a p-type GaAs second contact layer.

16. The method of manufacturing a semiconductor laser according to claim 8 wherein the active layer comprises a multi-quantum well structure having a plurality of $Ga_{0.5}In_{0.5}P$ quantum-well layers and $(Al_{0.5}Ga_{0.5})_{0.5}In_{0.5}P$ quantum-barrier layers.

17. The method of manufacturing a semiconductor laser according to claim 8 wherein the active layer comprises an $In_{0.5}Ga_{0.5}P$ natural superlattice.

18. A method of manufacturing a buried ridge semiconductor laser comprising:

growing semiconductor layers comprising at least a first conductivity type lower cladding layer, an active layer having a quantum-well structure, and a second conductivity type upper cladding layer on a semiconductor substrate;

forming an impurity diffusion source film having a stripe shape and comprising atoms producing the second conductivity type when diffused into the upper cladding layer only at each region where a window structure is to be formed;

forming a stripe-shaped ridge-etching mask of the upper cladding layer covering the impurity diffusion source film and part of the upper cladding layer;

etching the semiconductor layers using the ridge-etching mask so that the second conductivity type upper cladding layer has a stripe-shaped ridge;

growing a first conductivity type current blocking layer on both sides of the ridge, burying the ridge; and forming a window structure by diffusing the dopant atoms producing the second conductivity type from the impurity diffusion source film at each region where a window structure is to be formed into the active layer having the quantum-well structure, through the upper cladding layer, by heat treatment, thereby disordering the quantum-well structure of the active layer in the diffused region.

19. The method of manufacturing a semiconductor laser according to claim 18 wherein the impurity diffusion source film comprises a material comprising atoms producing the second conductivity type when diffused into the second conductivity type upper cladding layer.

20. The method of manufacturing a semiconductor laser according to claim 19 wherein the impurity diffusion source film is selected from the group consisting of ZnO, CdO, and MgO.

21. The method of manufacturing a semiconductor laser according to claim 18 wherein the impurity diffusion source film comprises a dopant impurity producing the second conductivity type when diffused into the lower cladding layer.

22. The method of manufacturing a semiconductor laser according to claim 21 including controlling the concentration of impurities diffused into the upper cladding layer by controlling the quantity of impurities in the impurity diffusion source film.

23. The method of manufacturing a semiconductor laser according to claim 21 wherein the impurity diffusion source film is selected from the group consisting of $Al_2O_3$, $SiO_2$, $Si_3N_4$, and SrO doped with one of Zn, Cd, and Mg, and $Al_2O_3$ doped with Si.

24. The method of manufacturing a semiconductor laser according to claim 18 including growing a second conductivity type first contact layer on the upper cladding layer.

25. The method of manufacturing a semiconductor laser according to claim 18 comprising:

as the ridge-etching mask, forming a film serving as a selective growth mask when the current blocking layer is grown, the film serving as a selective growth mask and partially covering the impurity diffusion source film; and removing the film serving as the selective growth mask after the ridge etching.

26. The method of manufacturing a semiconductor laser according to claim 18 including diffusing the dopant impurities during growth of the first conductivity type current blocking layer.

27. The method of manufacturing a semiconductor laser according to claim 18 including growing a second conductivity type second contact layer on the ridge and the first conductivity type current blocking layer after the growth of the first conductivity type current blocking layer.

28. The method of manufacturing a semiconductor laser according to claim 27 including diffusing dopant impurities during the growth of the first conductivity type current blocking layer and of the second contact layer.

29. The method of manufacturing a semiconductor laser according to claim 27 including diffusing dopant impurities during the growth of the first conductivity type current blocking layer and of the second contact layer and by annealing after all crystal growth is completed.

30. The method of manufacturing a semiconductor laser according to claim 29 including observing the degree of diffusion of impurities from the impurity diffusion source film into the upper cladding layer from a section of a wafer after all crystal growth is completed; and annealing to correct any insufficient amount of diffusion.

31. The method of manufacturing a semiconductor laser according to claim 24 wherein a semiconductor substrate is n type GaAs, the first conductivity type lower cladding layer is n-type $(Al_{0.7}Ga_{0.3})_{0.5}In_{0.5}P$, the active layer is $In_{0.5}Ga_{0.5}P$ having a quantum-well structure, and the second conductivity type upper cladding layer is p-type $(Al_{0.7}Ga_{0.3})_{0.5}In_{0.5}P$, and including a p-type GaAs first contact layer and a p-type GaAs second contact layer.

32. The method of manufacturing a semiconductor laser according to claim 24 wherein the active layer comprises a multi-quantum well structure having a plurality of $Ga_{0.5}In_{0.5}P$ quantum-well layers and $(Al_{0.5}Ga_{0.5})_{0.5}In_{0.5}P$ quantum-barrier layers.

33. The method of manufacturing a semiconductor laser according to claim 24 wherein the active layer comprises an $In_{0.5}Ga_{0.5}P$ natural superlattice.

34. The method of manufacturing a semiconductor laser according to claim 18 comprising:

forming the impurity diffusion source film on the upper cladding layer and patterning the film into two stripes covering regions corresponding to two window regions in the laser;

forming a ridge-etching mask layer on the impurity diffusion source film and patterning the ridge-etching mask layer into a stripe shape on a ridge to be formed in the laser as the ridge-etching mask; and forming two rectangular impurity diffusion source films by etching and removing parts of the impurity diffusion source film stripes not covered by the ridge-etching mask.

35. The method of manufacturing a semiconductor laser according to claim 18 including forming the impurity diffusion source film in the striped pattern comprising:

forming the impurity diffusion source film on the upper cladding layer and patterning the impurity diffusion source film into a stripe covering a region corresponding to a window region in the laser;

forming a ridge-etching mask layer on the impurity diffusion source film; and patterning the impurity diffusion source film and the ridge-etching mask layer to produce the ridge-etching mask covering the impurity diffusion source film and having a stripe shape where the ridge is to be formed.

36. A method of manufacturing a buried ridge semiconductor laser comprising:

growing semiconductor layers comprising at least a first conductivity type lower cladding layer, an active layer having a quantum-well structure, and a second conductivity type upper cladding layer on a semiconductor substrate;

forming a patterned impurity diffusion source film on a stripe-shaped region where a ridge is to be formed, the pattern of the patterned impurity diffusion source film consisting of a second impurity diffusion source film comprising atoms producing the second conductivity type when diffused into the upper cladding layer at a region where a window structure is to be formed in the stripe-shaped region and a first impurity diffusion source film comprising atoms producing the second conductivity type when diffused into the upper cladding layer throughout the stripe-shaped region outside the region where a window structure is to be formed;

ridge-etching the semiconductor crystal layers using a ridge-etching mask, masking a stripe-shaped region including the impurity diffusion source film so that the second conductivity type upper cladding layer has a stripe-shaped ridge;

forming a first conductivity type current blocking layer at each side of the ridge, burying the ridge;

forming a window structure by diffusing atoms producing the second conductivity type from the second impurity diffusion source film formed at the region where the window structure is to be formed in the ridge and into the active layer having the quantum-well structure through the upper cladding layer by heat treatment to disorder the active layer of the quantum-well structure in the diffused region in the active layer and forming a high dopant impurity concentration layer comprising a dopant impurity producing the second conductivity in the second conductivity type upper cladding layer throughout the ridge and outside the region where the window structure is formed by diffusing the atoms from the first impurity diffusion source film into the upper cladding layer.

37. The method of manufacturing a semiconductor laser according to claim 36 wherein formation of the first and second impurity diffusion source films comprises:

forming a diffusion-through film for reducing diffusion on the stripe-shaped ridge in a region outside the region where the window structure is to be formed; and forming the patterned impurity diffusion source film having a desired thickness on and throughout the stripe-shaped ridge.

38. The method of manufacturing a semiconductor laser according to claim 37 including forming the diffusion-through film by plasma CVD, the patterned impurity diffusion source film by sputtering, and the selective growth mask by thermal CVD.

39. The method of manufacturing a semiconductor laser according to claim 38 wherein formation of the first and second impurity diffusion source films comprises:

forming the second impurity diffusion source film at a region where the window structure is to be formed on the stripe-shaped ridge; and forming the first impurity diffusion source film on all of the stripe-shaped ridge.

40. The method of manufacturing a semiconductor laser according to claim 39 wherein patterning of the first and second impurity diffusion source films comprises:

forming a film comprising a material of the second impurity diffusion source film and patterning the film comprising the material of the second impurity diffusion source film into a stripe covering the region corresponding to the window structure of the laser;

patterning a mask comprising a material of the first impurity diffusion source film into a stripe covering the region where the ridge is to be formed; and etching removing an exposed part of the stripe of the second impurity diffusion source film along the region of the window to be formed in the laser using the first impurity diffusion source film as a mask.

41. The method of manufacturing a semiconductor laser according to claim 39 wherein patterning of the first and second impurity diffusion source films comprises:

forming a film comprising a material of the second impurity diffusion source film and patterning the film comprising the material of the second impurity diffusion source film into a stripe along the region corresponding to the window structure of the laser;

forming a mask comprising a material of the first impurity diffusion source film; and patterning a mask comprising a material of the second impurity diffusion source film along the region where the window structure is to be formed and the first impurity diffusion source film covering the second impurity diffusion source film into a stripe along the region where the ridge is to be formed in the laser.

42. The method of manufacturing a semiconductor laser according to claim 39 wherein the impurity diffusion source film comprises a material containing atoms producing the second conductivity type when diffused into the second conductivity type upper cladding layer.

43. The method of manufacturing a semiconductor laser according to claim 42 wherein the impurity diffusion source film is selected from the group consisting of ZnO, CdO, and MgO.

44. The method of manufacturing a semiconductor laser according to claim 39 wherein the impurity diffusion source film comprises a dopant impurity producing the second conductivity type when diffused into the second conductivity type upper cladding layer.

45. The method of manufacturing a semiconductor laser according to claim 44 including controlling the concentration of impurities diffused into the upper cladding layer by controlling the quantity of impurities in the impurity diffusion source film.

46. The method of manufacturing a semiconductor laser according to claim 5 wherein the impurity diffusion source film is selected from the group consisting of $Al_2O_3$, $SiO_2$, $Si_3N_4$, and SrO doped with one of Zn, Cd, and Mg, and $Al_2O_3$ doped with Si.

47. The method of manufacturing a semiconductor laser according to claim 39 including growing a second conductivity type first contact layer on the second conductivity type upper cladding layer.

48. The method of manufacturing a semiconductor laser according to claim 40 including forming a ridge etching mask on the first impurity diffusion source film simultaneously with patterning the first impurity diffusion source film.

49. The method of manufacturing a semiconductor laser according to claim 39 including diffusing the dopant impurities during growth of the first conductivity type current blocking layer.

50. The method of manufacturing a semiconductor laser according to claim 39 comprising growing a second conductivity type second contact layer on the ridge and the first conductivity type current blocking layer on each side of the ridge after the growth of the first conductivity type current blocking layer.

51. The method of manufacturing a semiconductor laser according to claim 50 including diffusing dopant impurities during the growth of the first conductivity type current blocking layer and of the second contact layer.

52. The method of manufacturing a semiconductor laser according to claim 51 including diffusing dopant impurities during the growth of the first conductivity type current blocking layer and of the second contact layer and by annealing after all crystal growth is completed.

53. The method of manufacturing a semiconductor laser according to claim 52 including observing the degree of diffusion of impurities from the impurity diffusion source film into the upper cladding layer from a section of a wafer after all crystal growth is completed; and annealing to correct any insufficient amount of diffusion.

54. The method of manufacturing a semiconductor laser according to claim 39 comprising:

forming a film serving as a selective growth mask on the impurity diffusion source film before the ridge-etching; and removing the film serving as the selective growth mask and the impurity diffusion source film after the ridge-etching but before the growth of the second conductivity type second contact layer.

55. The method of manufacturing a semiconductor laser according to claim 39 wherein the semiconductor substrate is n type GaAs, the first conductivity type lower cladding layer is n-type $(Al_{0.7}Ga_{0.3})_{0.5}In_{0.5}P$, the active layer is $In_{0.5}Ga_{0.5}P$, and the second conductivity type upper cladding layer is p-type $(Al_{0.7}Ga_{0.3})_{0.5}In_{0.5}P$, and including a p-GaAs first contact layer and a p-type GaAs second contact layer.

56. The method of manufacturing a semiconductor laser according to claim 39 wherein the active layer comprises a multi-quantum well structure having a plurality of $Ga_{0.5}In_{0.5}P$ quantum-well layers and $(Al_{0.5}Ga_{0.5})_{0.5}In_{0.5}P$ quantum-barrier layers.

57. The method of manufacturing a semiconductor laser according to claim 39 wherein the active layer comprises an $In_{0.5}Ga_{0.5}P$ natural superlattice.

* * * * *

UNITED STATES PATENT AND TRADEMARK OFFICE
CERTIFICATE OF CORRECTION

PATENT NO. : 5,556,804
DATED : September 17, 1996
INVENTOR(S) : Nagai

It is certified that error appears in the above-indentified patent and that said Letters Patent is hereby corrected as shown below:

Column 37, Line 22, before "active" insert --the--;

Line 46, change "of" to --on--;

Column 38, Line 56, change "a" to --the--;

Column 39, Line 12, change "a" (first occurrence) to --the--;

Column 41, Line 15, change "Al2o3" to --$Al_2O_3$--.

Signed and Sealed this

Twenty-eighth Day of January, 1997

Attest:

BRUCE LEHMAN

Attesting Officer     *Commissioner of Patents and Trademarks*